United States Patent
Sheppard et al.

(10) Patent No.: US 7,875,910 B2
(45) Date of Patent: Jan. 25, 2011

(54) INTEGRATED NITRIDE AND SILICON CARBIDE-BASED DEVICES

(75) Inventors: Scott T. Sheppard, Chapel Hill, NC (US); Adam William Saxler, Durham, NC (US); Thomas Smith, Raleigh, NC (US)

(73) Assignee: Cree, Inc., Durham, NC (US)

( * ) Notice: Subject to any disclaimer, the term of this patent is extended or adjusted under 35 U.S.C. 154(b) by 800 days.

(21) Appl. No.: 11/410,768

(22) Filed: Apr. 25, 2006

(65) Prior Publication Data

US 2006/0289901 A1    Dec. 28, 2006

Related U.S. Application Data

(63) Continuation-in-part of application No. 10/378,331, filed on Mar. 3, 2003, now Pat. No. 7,112,860.

(51) Int. Cl.
*H01L 29/80* (2006.01)
*H01L 21/338* (2006.01)

(52) U.S. Cl. ..................................... 257/256

(58) Field of Classification Search .......... 257/E27.001, 257/E27.006, E27.009, 256, 478, 416, 184, 257/195, 415, 458, 53, 76, 14, 192, 194, 257/24; 438/50, 483, 478, 169, 172, 481; 310/318, 317, 322
See application file for complete search history.

(56) References Cited

U.S. PATENT DOCUMENTS

| | | | |
|---|---|---|---|
| 3,955,160 A | 5/1976 | Duffy | 333/150 |
| 4,742,315 A * | 5/1988 | Schreilechner | 331/108 C |
| 4,912,063 A | 3/1990 | Davis et al. | 437/100 |

(Continued)

FOREIGN PATENT DOCUMENTS

CN    1309816 A    8/2001

(Continued)

OTHER PUBLICATIONS

Eickhoff et al. ("Novel Sensor Applications of Group-III Nitrides", Materials Research Society Symposium Proceedings, vol. 693, p. 781-792 (2002); XP009035257).*

(Continued)

*Primary Examiner*—Dao H Nguyen
*Assistant Examiner*—Tram H Nguyen
(74) *Attorney, Agent, or Firm*—Myers Bigel Sibley & Sajovec

(57) ABSTRACT

A monolithic electronic device includes a first nitride epitaxial structure including a plurality of nitride epitaxial layers. The plurality of nitride epitaxial layers include at least one common nitride epitaxial layer. A second nitride epitaxial structure is on the common nitride epitaxial layer of the first nitride epitaxial structure. A first plurality of electrical contacts is on the first epitaxial nitride structure and defines a first electronic device in the first nitride epitaxial structure. A second plurality of electrical contacts is on the first epitaxial nitride structure and defines a second electronic device in the second nitride epitaxial structure. A monolithic electronic device includes a bulk semi-insulating silicon carbide substrate having implanted source and drain regions and an implanted channel region between the source and drain regions, and a nitride epitaxial structure on the surface of the silicon carbide substrate. Corresponding methods are also disclosed.

11 Claims, 11 Drawing Sheets

U.S. PATENT DOCUMENTS

| | | | | |
|---|---|---|---|---|
| 4,912,064 | A | 3/1990 | Kong et al. | 437/100 |
| 4,946,547 | A | 8/1990 | Palmour et al. | 156/643 |
| 5,011,549 | A | 4/1991 | Kong et al. | 148/33.1 |
| 5,155,062 | A | 10/1992 | Coleman | 437/100 |
| 5,200,022 | A | 4/1993 | Kong et al. | 156/612 |
| 5,210,051 | A | 5/1993 | Carter, Jr. | 437/107 |
| 5,265,267 | A | 11/1993 | Martin et al. | 455/326 |
| 5,270,554 | A | 12/1993 | Palmour | 257/77 |
| 5,292,501 | A | 3/1994 | Degenhardt et al. | 424/49 |
| RE34,861 | E | 2/1995 | Davis et al. | 437/100 |
| 5,393,993 | A | 2/1995 | Edmond et al. | 257/77 |
| 5,405,797 | A * | 4/1995 | Brugger | 438/172 |
| 5,523,589 | A | 6/1996 | Edmond et al. | 257/77 |
| 5,576,589 | A | 11/1996 | Dreifus et al. | 310/313 A |
| 5,592,501 | A | 1/1997 | Edmond et al. | 372/45 |
| 5,739,554 | A | 4/1998 | Edmond et al. | 257/103 |
| 6,063,186 | A | 5/2000 | Irvine et al. | 117/89 |
| 6,217,662 | B1 | 4/2001 | Kong et al. | 118/725 |
| 6,218,680 | B1 | 4/2001 | Carter, Jr. et al. | 257/77 |
| 6,265,727 | B1 | 7/2001 | Kozodoy et al. | 257/77 |
| 6,285,866 | B1 | 9/2001 | Lee et al. | 455/318 |
| 6,297,522 | B1 | 10/2001 | Kordina et al. | 257/77 |
| 6,300,706 | B1 | 10/2001 | Grudkowski et al. | 310/334 |
| 6,316,793 | B1 | 11/2001 | Sheppard et al. | 257/103 |
| 6,377,138 | B1 | 4/2002 | Takagi et al. | |
| 6,396,080 | B2 | 5/2002 | Carter, Jr. et al. | 257/77 |
| 6,403,982 | B2 | 6/2002 | Carter, Jr. et al. | 257/77 |
| 6,495,852 | B1 | 12/2002 | Mouri | 257/21 |
| 6,518,637 | B1 | 2/2003 | Thompson et al. | 257/77 |
| 6,530,990 | B2 | 3/2003 | Kong et al. | |
| 6,548,333 | B2 | 4/2003 | Smith | 438/172 |
| 6,555,946 | B1 | 4/2003 | Finder et al. | 310/324 |
| 6,596,079 | B1 | 7/2003 | Vaudo et al. | |
| 6,686,616 | B1 | 2/2004 | Allen et al. | 257/280 |
| 6,797,069 | B2 | 9/2004 | Paisley et al. | |
| 6,849,882 | B2 * | 2/2005 | Chavarkar et al. | 257/191 |
| 7,045,404 | B2 | 5/2006 | Sheppard et al. | |
| 7,112,860 | B2 * | 9/2006 | Saxler | 257/416 |
| 7,230,284 | B2 * | 6/2007 | Parikh et al. | 257/194 |
| 7,294,540 | B2 * | 11/2007 | Lee et al. | 438/172 |
| 2001/0035695 | A1 | 11/2001 | Kadota et al. | 310/313 R |
| 2002/0090454 | A1 | 7/2002 | Paisley et al. | 427/248.1 |
| 2002/0113668 | A1 | 8/2002 | Tanaka et al. | 333/195 |
| 2002/0158707 | A1 | 10/2002 | Noguchi | 333/133 |
| 2002/0167023 | A1 | 11/2002 | Chavarkar et al. | 257/194 |
| 2002/0170491 | A1 | 11/2002 | Mueller | 117/108 |
| 2003/0022412 | A1 * | 1/2003 | Higgins et al. | 438/50 |
| 2003/0030119 | A1 | 2/2003 | Higgins et al. | 257/428 |
| 2003/0205721 | A1 * | 11/2003 | Nishii et al. | 257/194 |
| 2004/0007715 | A1 * | 1/2004 | Webb et al. | 257/192 |
| 2005/0051793 | A1 | 3/2005 | Ishida et al. | |
| 2006/0065929 | A1 | 3/2006 | Lee et al. | |
| 2006/0081897 | A1 | 4/2006 | Yoshida | |
| 2006/0108660 | A1 | 5/2006 | Ui | |
| 2007/0018199 | A1 | 1/2007 | Sheppard et al. | |
| 2007/0018210 | A1 | 1/2007 | Sheppard | |
| 2007/0158683 | A1 | 7/2007 | Sheppard et al. | |
| 2008/0169474 | A1 | 7/2008 | Sheppard | |

FOREIGN PATENT DOCUMENTS

| | | |
|---|---|---|
| EP | 0373 606 | 12/1989 |
| EP | 0 373 606 A1 | 6/1990 |
| EP | 0 810 726 B1 | 7/2005 |
| EP | 1 643 561 A2 | 4/2006 |
| EP | 1 734 647 A1 | 12/2006 |
| EP | 1 798 762 A2 | 6/2007 |
| GB | 2 338 107 A | 12/1999 |
| JP | 58-197910 | 11/1983 |
| JP | 58 197910 A | 11/1983 |
| JP | 58197910 | 11/1983 |
| JP | 02-214321 | 8/1990 |
| JP | 05-183381 | 7/1993 |
| JP | 05 183381 A | 7/1993 |
| JP | 05183381 | 7/1993 |
| JP | 06-303088 | 10/1994 |
| JP | 2000-150417 | 5/2000 |
| KR | 1998-702240 | 7/1998 |
| KR | 2000-0005908 | 1/2000 |
| KR | 2000-0068639 | 11/2000 |
| KR | 2002-0087414 | 11/2002 |
| WO | WO 2004/079904 A2 | 9/2004 |

OTHER PUBLICATIONS

First Office Action, Chinese Application No. 200480005682.X, Issued Jul. 11, 2008.

Communication Pursuant to Article 94(3) EPC (4 pages) corresponding to European Application No. 04716159.1; Mailing Date: Nov. 24, 2008.

M. Eickhoff et al., "Novel Sensor Applications of group-III nitrides", Materials Research Society Symposium Proceedings, vol. 693, pp. 781-792 (2002); XP009035257.

European Office Action for European Patent Application No. 04716159.1; Oct. 24, 2007.

Hagon et al Integrated programmable analog matched filters for spread spectrum applications *IEEE Ultrasonics Symposium*, Monterey, CA, USA 333-335 (1983).

Stutzmann et al. "GaN-based heterostructures for sensor applications" *Diamond and Related Materials* 11(3-6):886-891 (2002).

Takagaki et al. "Superhigh-frequency surface-acoustic-wave transducers using AlN layers grown on SiC substrates" *Applied Physics Letters* 81(14):2538-2540 (2002).

Tsubouchi et al. Zero temperature coefficient SAW delay line on AlN epitaxial films: *IEEE Ultrasonics Symposium*, Atlanta, GA, USA 299-310 (1983).

U.S. Appl. No. 11/286,805, filed Nov. 23, 2005, Saxler et al.

International Search Report and Written Opinion for PCT US2004/006232; date of mailing Nov. 11, 2004.

Hagon et al. "Integrated Programmable Analog Matched Filters for Spread Spectrum Applications," IEEE Ultrasonics Symposium, 1973, pp. 333-335.

Stutzmann et al. "GaN-based heterostructures for sensor applications," *Diamond and Related Materials*, vol. 11, No. 3-6, Mar. 2002, pp. 886-891.

Takagaki et al. "Superhigh-frequency surface-acoustic-wave transducers using AlN layers grown on SiC substrates," *Applied Physics Letters*, vol. 81, No. 14, Sep. 30, 2002, pp. 2538-2540.

Tsubouchi et al. "Zero Temperature Coefficient Saw Delay Line on AlN Epitaxial Films," IEEE Ultrasonics Symposium, Atlanta, GA, 1983, pp. 299-310.

Invitation to Pay Additional Fees issued Aug. 31, 2004 for corresponding PCT application No. PCT/US2004/006232.

Ng, K.N., "Interdigital Transducer", *Complete Guide to Semiconductor Devices*, Ch. 66 (2000) pp. 511-516.

U.S. Patent Application for *Induction Heating Devices and Methods for Controllably Heating an Article*, U.S. Appl. No. 10/017,492, filed Oct. 30, 2001.

U.S. Patent Application for *Gas Driven Planetary Rotation Apparatus and Methods for Forming Silicon Carbide Layer*, U.S. Appl. No. 10/117,858, filed Apr. 8, 2002.

U.S. Patent Application for *Susceptor Designs for Silicon Carbide Thin Films*, U.S. Appl. No. 09/715,576, filed Mar. 3, 2003.

Sheppard et al., "Improved 10-GHz Operation of GaN/AlGaN HEMTs on Silicon Carbide", *Materials Science Forum*, vols. 338-342 (2000) pp. 1643-1646.

Sheppard et al., "High Power Demonstration at 10 GHz with GaN/AlGaN HEMT Hybrid Amplifiers", *Presented at the 58th DRC*, Denver, CO (Jun. 2000) 20 pages.

Hagon et al., "Integrated Programmable Analog Matched Filters for Spread Spectrum Applications," 1973 Ultrasonics Symposium Proceedings, IEEE, pp. 333-335, USA, 1973.

Tsubouchi et al., "Zero Temperature Coefficient Saw Delay Line on AlN Epitaxial Films," 1983 Ultrasonics Symposium Proceedings, IEEE, pp. 299-310, USA, 1983.

Office Notice of Rejection, Mar. 2, 2010, Japanese Patent Application No. 2006-508961, 9 pages.

International Search Report and Written Opinion (15 pages) corresponding to International Application No. PCT/US2009/000802; Mailing Date: Jun. 3, 2009.

Official Notice of Rejection, mailed on Aug. 6, 2010, JP Patent Application No. 2006-508961, 8 pages.

Tsubouchi et al. " Zero Temperature Coefficient Saw Delay Line on AlN Epitaxial Films", Research Institute of Electrical Communication, Tohoku Univ., Katahira 2-1-1, Sendai 980, Japan; 1983 Ultrasonics Symposium; pp. 299-310.

Office Action corresponding to Korean Patent Application No. 10-2005-7016258 dated Oct. 8, 2010; 4 pages.

English Translation of Office Action corresponding to Korean Patent Application No. 10-2005-7016258, 4 pages.

* cited by examiner

INTEGRATED NITRIDE AND SILICON CARBIDE-BASED DEVICES

CLAIM OF PRIORITY

This application claims priority under 35 U.S.C. §120 as a continuation-in-part application of U.S. patent application Ser. No. 10/378,331, filed on Mar. 3, 2003 now U.S. Pat. No. 7,112,860, the disclosure of which is hereby incorporated by reference herein as if set forth in its entirety.

FIELD OF THE INVENTION

The present invention relates to nitride-based devices. In particular, the present invention relates to the monolithic integration of different types of nitride-based devices on a common substrate, and resulting devices.

BACKGROUND

Wide bandgap semiconductor materials, including Group III-nitrides, such as gallium nitride, aluminum gallium nitride, indium nitride and alloys thereof, and silicon carbide, are desirable materials for the fabrication of high power, high temperature and/or high frequency devices. These wide bandgap materials have high electric field breakdown strengths and high electron saturation velocities as compared to other semiconductor materials such as gallium arsenide and silicon.

Electrical circuits requiring high power handling capability (>20 watts) while operating at high frequencies such as radio frequencies, including for example, S-band (2-4 GHz) and X-band (8-12 GHz), have in recent years become more prevalent. Because of the increase in high power, high frequency circuits there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETS) were commonly used for high frequency applications but the power handling capability of previously known JFETs may also be limited.

Recently, metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measure of the ease of electron motion within a semiconductor media and is defined as the rate of change of electron drift velocity with respect to electric field at a given electric field. In the past, semiconductor materials which have a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity may translate to shorter transition times from source to drain.

Electric breakdown field is the field strength at which breakdown of the Schottky junction and the current through the gate of the device suddenly increases. A high electric breakdown field material may be preferred for high power, high frequency transistors because larger electric fields generally can be supported by a given dimension of material. Larger electric fields may allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than low power transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material may remain at a lower temperature and may be capable of carrying larger currents with lower leakage currents. Reliability physics also predicts a longer lifetime for a device that operates at lower operating temperature.

In the past, high frequency MESFETs have been manufactured of n-type III-V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4\times10^6$ V/cm, high saturated electron drift velocity of about $2.0\times10^7$ cm/sec and high thermal conductivity of about 4.9 W/cm-K indicate that SiC would be suitable for high frequency, high power applications.

SiC-based MESFET structures and their fabrication are described in U.S. Pat. No. 5,270,554 to Palmour et al. and U.S. Pat. No. 5,925,895 to Sriram et al., both of which are incorporated herein by reference as if fully set forth herein. SiC MESFET structures and fabrication are also described in U.S. application Ser. No. 09/567,717 filed May 10, 2000 by Allen, et al., the disclosure of which is incorporated herein by reference as if fully set forth herein.

In the III-nitride material system, a device of particular interest for high power and/or high frequency applications is the high electron mobility transistor (HEMT), which is also known as a heterostructure field effect transistor (HFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped, smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity.

In electronic communication systems, it is usually desirable to amplify signals before transmission (power amplifier) or after reception (low noise amplifier). It is also often desirable to filter such signals immediately before or after amplification. Directing the RF signal to specific portions of a multifunction chip can be accomplished with a monolithic RF switch that is low-loss and can provide high isolation. Other types of non-power-amplifier circuits that would benefit from monolithic integration with the power amplifier circuits are limiter circuits and phase shifters. In high frequency communication systems, such amplification may be performed efficiently using an amplifier circuit incorporating a SiC MESFET or a Group III-nitride based transistor. Filtering may be efficiently performed using a SAW filter.

In order to minimize the number of circuit elements required to implement a communication system and simplify its design, it is desirable to integrate as many components as possible on a single chip. Attempts to integrate SAW devices with other devices have been made. However, such devices have typically required that the piezoelectric crystal be bonded onto a semiconductor substrate (such as silicon) on which active electronic components are formed.

Acoustic wave devices form a class of electronic devices that process signals that exist as acoustic (i.e. sound or compression) waves traveling in piezoelectric crystals. Piezoelectric crystals are characterized by the fact that when the material is mechanically stressed (i.e. compressed or placed under tension), an associated electric field is induced. Likewise, when an electric field is applied to a piezoelectric crystal, the material becomes mechanically stressed in a predetermined manner. It is possible to exploit these characteristics to perform many different functions with a piezoelectric crystal.

For example, piezoelectric microphones convert acoustic waves traveling though air into electronic signals. Piezoelectric speakers and buzzers perform the opposite function. Piezoelectric sensors detect changes in pressure, temperature, torque, humidity and/or a wide range of other phenomena.

Common piezoelectric materials include quartz (SiO$_2$), zinc oxide (ZnO), barium titanate (BaTiO$_3$), lithium tantalate (LiTaO$_3$) and lithium niobate (LiNbO$_3$). However, other materials, most notably silicon carbide (SiC) and the Group III-nitride materials such as aluminum nitride (AlN) and Gallium Nitride (GaN) are piezoelectric and may be used to form acoustic wave devices.

When a time-varying electric field is applied to a portion of a piezoelectric crystal, the applied electric field induces an acoustic wave that propagates through the crystal. Acoustic waves may travel through a piezoelectric material in a number of modes. For example, acoustic waves may travel through the body of the material—so-called "bulk" waves—or on the surface of the material. Waves that travel along the surface of the piezoelectric material are generally referred to as surface acoustic waves (or SAWs), and devices that process surface acoustic waves are referred to as surface acoustic wave devices, or SAW devices.

A simple surface acoustic wave device comprises a piezoelectric crystal or a thin film of piezoelectric material on a substrate. Interdigitated metal stripes on the surface of the crystal form transmitting and receiving electrodes. The metal electrodes convert electrical energy into mechanical stress in the crystal and vice versa. Hence, the interdigital electrodes formed on a piezoelectric material are referred to as interdigital transducers, or IDTs.

A simple surface acoustic wave device is illustrated in perspective in FIG. 10. The SAW device comprises a piezoelectric film 2 formed on a substrate 1. A metal (usually aluminum) is deposited on the film and patterned using standard photolithographic or liftoff techniques to form the input IDT 3 and the output IDT 4. The thickness of the piezoelectric film is generally on the order of one SAW wavelength.

In operation, an electric signal may be applied to the input IDT 3. The input signal causes a surface acoustic wave to be induced in the piezoelectric film 2 and propagate along the surface of the film 2 towards the output IDT 4. The shape of the generated wave depends on the electric signal applied to the input IDT, the design and orientation of the IDT fingers, and the piezoelectric material used. When the wave reaches the output IDT 4, a voltage is induced across the fingers of the IDT 4 which is then output from the device. The shape of the output wave is affected by the design of the output IDT 4.

FIG. 11 illustrates some design parameters for IDTs. The finger period D determines the wavelength λ of the SAW generated by the IDT. The linewidth L and space S of the fingers are generally equal to λ/4. The number of fingers determines the coupling efficiency of the IDT, and the width W of the overlap of fingers affects the frequency response of the finger pair. By changing the overlap of finger pairs within an IDT, various filter functions can be realized.

Surface acoustic wave devices have many different applications in digital and analog electronics. For example, surface acoustic wave devices may be used as bandpass or bandstop filters, duplexers, delay lines, resonators and/or impedance elements among other things. They may also be used to perform digital functions such as convolution, correlation, pulse compression and/or digital filtering (for example in spread-spectrum communication systems) depending on the design of the device, and in particular depending on the layout of the interdigital transducers. The design and fabrication of surface acoustic wave devices are described in Chapter 66 of K. Ng, *Complete Guide to Semiconductor Devices*, McGraw Hill (1995).

The velocity of surface acoustic waves in a device depends on the material from which the device is constructed and the mode of propagation of the SAW. For example, the propagation velocity (also called the SAW velocity) of first order Rayleigh-mode acoustic waves in GaN is around 3600 m/s, while the corresponding SAW velocity in AlN is about 5800 m/s, and over 6800 m/s in SiC. For RF devices, the SAW velocity determines the bandwidth of signals that can be processed by the device. The fundamental operating frequency ($f_0$) of a SAW device is given by the formula:

$$f_0 = \frac{v}{\lambda}$$

where v is the SAW velocity and λ is the wavelength. As discussed above, the wavelength of the device is determined by the finger period of the IDT. The width and spacing of IDT fingers (and thus the finger period) is limited by the resolution of photolithographic techniques. Thus, for a given finger period, increasing the SAW velocity increases the fundamental operating frequency of the device. Stated differently, having a higher SAW velocity permits a device to process higher-frequency signals for a given device geometry. Accordingly, the Group III-nitrides and SiC may be desirable piezoelectric materials for the fabrication of SAW devices.

In addition to integrating SAW devices with nitride devices, it may be desirable to integrate other types of nitride devices together on a single substrate for more efficient manufacturing and/or operation. However, in the past it has proved difficult to provide multiple device types on a common substrate due to the different epitaxial semiconductor structures required for different types of devices.

SUMMARY OF THE INVENTION

Some embodiments of the invention provide a monolithic electronic device including a common nitride epitaxial layer, a first type of nitride device including a first epitaxial nitride structure on the common nitride epitaxial layer, and a second type of nitride device, different from the first type of nitride device, including a second epitaxial nitride structure on the common nitride epitaxial layer. A first plurality of electrical contacts is on the first epitaxial nitride structure and defines a first electronic device of the first type of nitride device, and a second plurality of electrical contacts is on the second epitaxial nitride structure and defines a second electronic device of the second type of electronic device.

The first epitaxial nitride structure may include a nitride channel layer, a nitride barrier layer on the nitride channel layer, the nitride barrier layer having a higher bandgap than the nitride channel layer. The nitride barrier layer and the nitride channel layer are configured to cooperatively induce a two-dimensional electron gas at an interface between the nitride channel layer and the nitride barrier layer.

The monolithic electronic device may further include a high bandgap layer on the barrier layer and a silicon nitride layer on the high bandgap layer.

The second nitride epitaxial structure may include a layer of $Al_xGa_{1-x}N$ ($0 \leq x \leq 1$) having a thickness of about 300 Å to about 1000 Å.

The first electronic device may include a high electron mobility transistor. The second electronic device may include a surface acoustic wave device, a diode, and/or a field effect transistor. In particular, the second electronic device may include source, drain and gate contacts, and the gate and drain contacts of the second electronic device may be electrically coupled to form an anode.

The second epitaxial nitride structure may include a first layer of n-type $Al_xGa_{1-x}N$ ($0 \leq x \leq 1$) on the first epitaxial nitride structure and a second layer of n-type $Al_xGa_{1-x}N$ ($0 \leq x \leq 1$) on the first layer of n-type $Al_xGa_{1-x}N$ ($0 \leq x \leq 1$). The first layer of n-type $Al_xGa_{1-x}N$ ($0 \leq x \leq 1$) may have a surface charge density of about $1 \times 10^{14}$ cm$^{-2}$, and the second layer of n-type $Al_xGa_{1-x}N$ ($0 \leq x \leq 1$) may have a doping concentration of less than about $1 \times 10^{16}$ cm$^{-3}$.

The common epitaxial layer may include a layer of semi-insulating $Al_xGa_{1-x}N$ ($0 \leq x \leq 1$).

A monolithic electronic device according to further embodiments of the invention includes a nitride epitaxial structure including a nitride channel layer, and a nitride barrier layer on the nitride channel layer. The nitride barrier layer has a higher bandgap than the nitride channel layer, and the nitride barrier layer and the nitride channel are configured to cooperatively induce a two-dimensional electron gas at an interface between the nitride channel layer and the nitride barrier layer. An $Al_xGa_{1-x}N$ ($0 \leq x \leq 1$) layer is on the barrier layer, and a first gate electrode is recessed through the $Al_xGa_{1-x}N$ ($0 \leq x \leq 1$) layer, the first gate electrode defining a first transistor device. A second gate electrode, defining a second transistor device, is on the $Al_xGa_{1-x}N$ ($0 \leq x \leq 1$) layer.

The monolithic electronic device may further include a silicon nitride layer on the $Al_xGa_{1-x}N$ ($0 \leq x \leq 1$) layer. The first gate electrode and the second gate electrode may both be recessed through the silicon nitride layer. The silicon nitride layer may include a high purity silicon nitride layer.

The monolithic electronic device may further include a source/drain electrode between the first gate electrode and the second gate electrode. The source/drain electrode is recessed through the $Al_xGa_{1-x}N$ ($0 \leq x \leq 1$) layer and provides a source/drain contact for both the first electronic device and the second electronic device.

A monolithic electronic device according to still further embodiments of the invention includes a bulk semi-insulating silicon carbide substrate, source and drain regions in a surface of the silicon carbide substrate, a channel region in the silicon carbide substrate between the source and drain regions, and a nitride epitaxial structure on the surface of the silicon carbide substrate. The source and drain regions and the channel regions may include implanted regions.

The monolithic electronic device may further include a first passivation layer on the implanted channel region and the implanted source and drain regions of the silicon carbide substrate, and a first gate contact on the silicon carbide substrate between the implanted source and drain regions, and a second gate contact on the nitride epitaxial layer. The first gate contact extends through the passivation layer.

The first passivation layer may extend onto the nitride epitaxial layer, and the second gate contact may extend through the first passivation layer.

The monolithic electronic device may further include a second passivation layer on the nitride epitaxial structure, the second passivation layer including a material different from the first passivation layer. The second gate contact may extend through the second passivation layer.

The first gate contact may be a control contact for a silicon carbide-based transistor device and the second gate contact may be a control contact for a nitride-based transistor device, and the electronic device may further include an interconnect metallization connecting the silicon carbide-based transistor device and the nitride-based transistor device.

Methods of forming a monolithic electronic device according to some embodiments of the invention include forming a first nitride epitaxial structure including a plurality of nitride epitaxial layers including at least one common nitride epitaxial layer, forming a second nitride epitaxial structure on the common nitride epitaxial layer of the first nitride epitaxial structure, forming a first plurality of electrical contacts on the first epitaxial nitride structure, the first plurality of contacts defining a first electronic device in the first nitride epitaxial structure, and forming a second plurality of electrical contacts on the first epitaxial nitride structure, the second plurality of contacts defining a second electronic device in the second nitride epitaxial structure.

Forming the first nitride epitaxial structure may include forming a nitride channel layer, forming a nitride barrier layer on the nitride channel layer, the nitride barrier layer having a higher bandgap than the nitride channel layer. The nitride barrier layer and the nitride channel are configured to cooperatively induce a two-dimensional electron gas at an interface between the nitride channel layer and the nitride barrier layer.

The methods may further include forming a high bandgap layer on the barrier layer, and forming a nitride layer, such as silicon nitride and/or gallium nitride, on the high bandgap layer.

Forming the second epitaxial structure may include forming a first layer of n-type $Al_xGa_{1-x}N$ ($0 \leq x \leq 1$) on the first epitaxial structure, and forming a second layer of n-type $Al_xGa_{1-x}N$ ($0 \leq x \leq 1$) on the first layer of n-type $Al_xGa_{1-x}N$ ($0 \leq x \leq 1$). The first layer of n-type $Al_xGa_{1-x}N$ ($0 \leq x \leq 1$) may have a surface charge density of about $1 \times 10^{14}$ cm$^{-2}$, and the second layer of n-type $Al_xGa_{1-x}N$ ($0 \leq x \leq 1$) may have a doping concentration of less than about $1 \times 10^{16}$ cm$^{-3}$.

Methods of fabricating a monolithic electronic device according to further embodiments of the invention include implanting source and drain regions in a surface of a bulk semi-insulating silicon carbide substrate, implanting a channel region in the silicon carbide substrate between the implanted source and drain regions, and forming a nitride epitaxial structure on the surface of the silicon carbide substrate.

The methods may further include forming a first passivation layer on the implanted channel region and the implanted source and drain regions of the silicon carbide substrate, and forming a first gate contact on the silicon carbide substrate between the implanted source and drain regions, and forming a second gate contact on the nitride epitaxial layer. The first gate contact extends through the passivation layer.

The first passivation layer may extend onto the nitride epitaxial layer, and the second gate contact may extend through the first passivation layer.

The methods may further include forming a second passivation layer on the nitride epitaxial structure, the second passivation layer including a material different from the first passivation layer. The second gate contact may extend through the second passivation layer.

The first gate contact may be a control contact for a silicon carbide-based transistor device and the second gate contact may be a control contact for a nitride-based transistor device, and the methods may further include forming an interconnect metallization to connect the silicon carbide-based transistor device and the nitride-based transistor device.

DETAILED DESCRIPTION OF EMBODIMENTS OF THE INVENTION

The present invention now will be described more fully hereinafter with reference to the accompanying drawings, in which various embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. Moreover, it will be understood that when a first element or layer is described as "in electrical contact" with a second element or layer, the first and second elements or layers need not be in direct physical contact with one another, but may be connected by intervening conductive elements or layers which permit current flow between the first and second elements or layers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
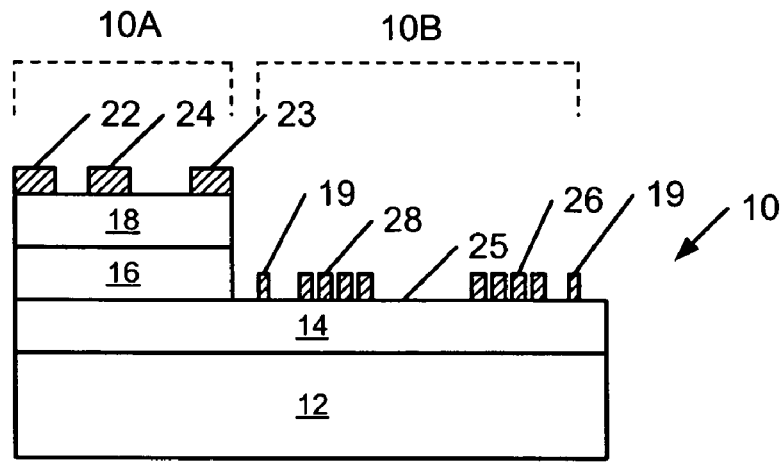
FIGS. 1A-1C are schematic drawings illustrating embodiments of the present invention along with device precursors that may be an intermediate step in the fabrication of a device as illustrated.

Embodiments of the present invention are schematically illustrated as an integrated SAW device/transistor 10 in the cross-sectional view of FIG. 1A. In the embodiment illustrated in FIG. 1A, a transistor structure 10A of a device 10 comprises a high electron mobility transistor (HEMT); however, it will be appreciated by those skilled in the art that the transistor structure 10A (as well as the transistor structures illustrated in connection with other embodiments of the invention described below) may comprise one or more other types of devices instead of or in addition to a HEMT. For example, the transistor structure 10A may comprise a MESFET, MOSFET, JFET or other device.

The integrated device 10 includes a substrate 12 that may, for example, be silicon carbide (SiC), such as semi-insulating silicon carbide of the 4H polytype. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

An aluminum nitride buffer layer 14 on the substrate 12 provides an appropriate crystal structure transition between the silicon carbide substrate and the remainder of the device. In the embodiments illustrated in FIG. 1A, the aluminum nitride buffer layer 14 also forms a piezoelectric film on which a SAW device 10B is fabricated as described in more detail below. The buffer layer 14 and subsequent GaN-based layers may be formed by MOCVD, MBE, or any other suitable growth technique for forming high-quality epitaxial layers.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ or $In_yAl_xGa_{1-x-y}N$ where $0 \leq x \leq 1$, $0 \leq y \leq 1$ and $x+y \leq 1$ are often used to describe them.

Appropriate semi-insulating SiC substrates are manufactured by, for example, Cree, Inc., of Durham, N.C., the assignee of the present invention, and the methods for producing are described, for example, U.S. Pat. Nos. Re. 34,861; 4,946,547; 5,200,022; 6,218,680; 6,403,982; and 6,396,080, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference.

Suitable structures for GaN-based HEMTs are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER" and U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosures of which are hereby incorporated by reference.

Continuing with the description of FIG. 1A, a channel layer 16, which in some embodiments is GaN, is formed on the buffer layer 14. The channel layer 16 is preferably undoped, but may be doped with various substances in order to modify the electron concentration in the sheet charge region or the behavior of the conduction band $E_c$ and valence band $E_v$ in the area below the sheet charge region. In some embodiments, the channel layer 16 is about 1 to 5 μm thick. In some embodiments, the channel layer 16 may comprise a thick (1 to 5 μm) GaN-based buffer layer with a thin (approximately 100 Å) high-quality channel region formed thereon.

The barrier layer 18 is formed on the channel layer 16. In some embodiments, the barrier layer 18 may comprise AlGaN, thereby forming a heterojunction between the channel layer 16 and the barrier layer 18. The barrier layer 18 preferably has an aluminum composition of between 20% and 40% and may be doped with silicon at a doping concentration of about $2 \times 10^{18}$ cm$^{-3}$. The barrier layer 18 may be between about 15 nm and 40 nm in thickness, and is preferably about 25 nm thick.

As described above, because of the AlGaN/GaN heterobarrier at the interface between the channel layer 16 and the barrier layer 18, a two dimensional electron gas is induced at the interface. An ohmic source electrode 22 and an ohmic drain electrode 23 are formed on the surface of the barrier layer 18. The source 22 and drain 23 ohmic electrodes may be Ti/Si/Ni, Ti/Al/Ni, Ti/Al/Ni/Au or any other suitable material that forms an ohmic contact to n-type AlGaN. Appropriate ohmic contacts for AlGaN/GaN HEMT devices are described in S. T. Sheppard, W. L. Pribble, D. T. Emerson, Z. Ring, R. P. Smith, S. T. Allen and J. W. Palmour, "High Power Demonstration at 10 GHz with GaN/AlGaN HEMT Hybrid Amplifiers," Presented at the 58th Device Research Conference, Denver, Colo. June 2000, and S. T. Sheppard, K. Doverspike, M. Leonard, W. L. Pribble, S. T. Allen and J. W. Palmour, "Improved 10-GHz Operation of GaN/AlGaN HEMTs on Silicon Carbide," Mat. Sci. Forum, Vols. 338-342 (2000), pp. 1643-1646.

The distance between the source electrode 22 and the drain electrode 23 is typically about 2-4 μm.

In some embodiments, a thin (20-40 Å), undoped GaN cap layer (not shown) may be formed on the surface of the barrier layer 18 between the source 22 and the drain 23 ohmic electrodes. The design and effect of such cap layers is described in detail in U.S. application Ser. No. 09/904,333 to Smith for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME" the disclosure of which is hereby incorporated by reference.

The gate electrode 24 is formed between the source 22 and the drain 23 electrodes. In certain embodiments, the gate electrode 24 is formed of platinum, nickel or any other suitable metal that forms a non-ohmic contact to n-type $Al_xGa_{1-x}N$. The gate electrode 24 may be capped with an additional metal layer in a T-gate configuration, or a T-gate may be formed in one process step. As is known in the art, T-gate configurations are particularly suitable for RF and microwave devices.

The barrier layer 18 may also be provided with multiple layers as described in the above-referenced U.S. patent application Ser. No. 10/102,272, to Smorchkova et al. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering.

As illustrated in FIG. 1A, a portion of the surface 25 of the buffer layer 14, such as an AlN buffer layer, is exposed. A first plurality of metal fingers 26 forms an input IDT on the exposed surface 25, while a second plurality of metal fingers 28 forms an output IDT. The input IDT 26, the output IDT 28 and the AlN buffer layer 14 form a surface acoustic wave device 10B integrated on the same substrate as the transistor 10A. The IDTs 26, 28 may be formed of aluminum or any other suitable metal. Since the IDTs 26, 28 do not have to form an ohmic or other electrical contact with the buffer layer 14, many different metals may be employed (including for example the same metals used for the gate 24, the source 22 and drain 23 ohmic contacts and/or metal interconnections to reduce the number of metallization steps required).

The thickness of the buffer layer 14 affects the SAW propagation characteristics of SAW structure 10B. In general, a surface acoustic wave propagating in a device extends for a distance of about one wavelength into the structure. In some embodiments, the buffer layer is about 250 nm or less. In that case, the SAW velocity of the propagating wave may be dominated by the SiC substrate, which has a higher SAW velocity than AlN. Also, the orientation of the SAW IDT fingers 26, 28 may be chosen so as to optimize the performance of the device. Although it has been reported that SAW propagation is isotropic in the c-plane of AlN and SiC, it is possible to fabricate devices using off-axis cut SiC substrates, which may make the propagation of surface acoustic waves dependent on orientation. For example, SiC MESFETs are typically manufactured using 8° off-axis wafers.

The input IDT 26 or the output IDT 28 may be connected to the source 22, the drain 23 and/or the gate 24 of transistor 10A via an overlayer metal (not shown), or via wire bonding or any other suitable technique so that electrical signals can be communicated from transistor 10A to SAW device 10B and vice versa.

Figure 9:
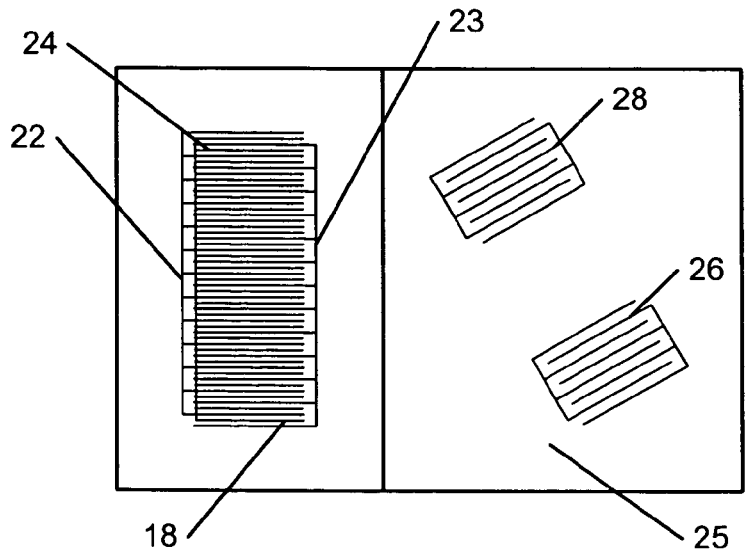
FIG. 9 is a schematic drawing illustrating embodiments of the present invention.
Figure 10:
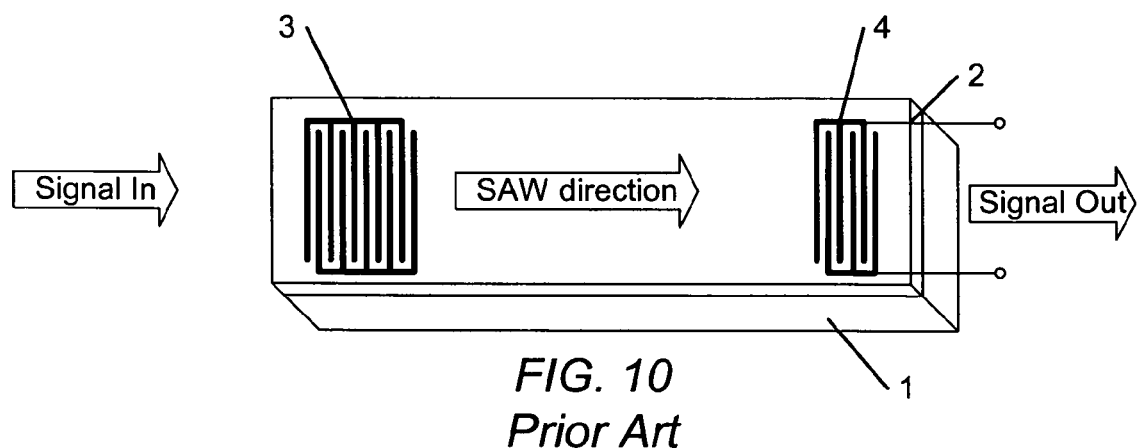
FIG. 10 is a perspective drawing illustrating a conventional surface acoustic wave device.
Figure 11:
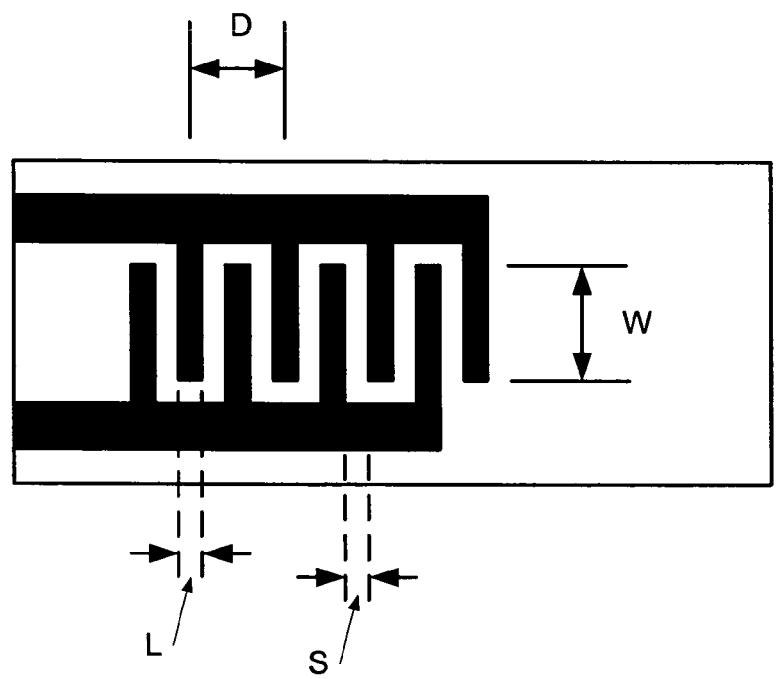
FIG. 11 is a schematic drawing illustrating the layout of an interdigital transducer of a conventional surface acoustic wave device.

To reduce and/or minimize undesired reflections and interference from the transistor 10A, the die may be cut at an angle different from the orientation of the IDT fingers 26, 28 as illustrated in FIG. 9. In addition, SAW reflectors and/or absorbers 19 may be formed on the device adjacent the input IDT 26 and/or the output IDT 28 to minimize undesired interference. The design of SAW reflectors and absorbers is well known to those skilled in the design of SAW devices.

Figure 1B:
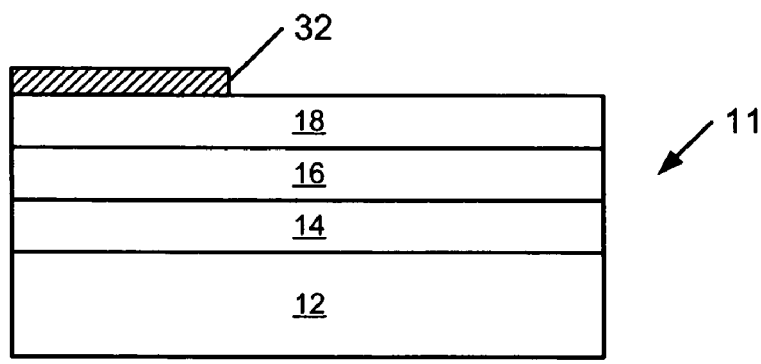
Figure 1C:
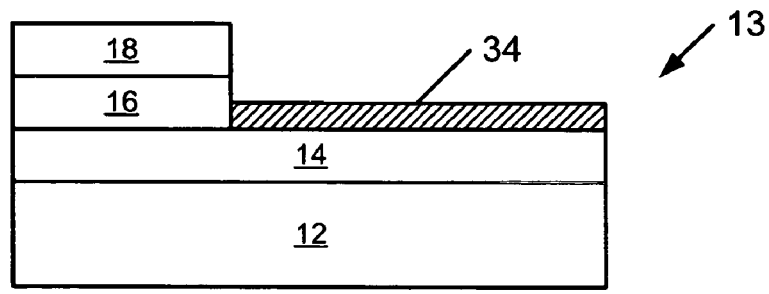

Precursor structures illustrating alternative methods of fabricating the device 10 are illustrated in FIGS. 1B and 1C. As illustrated in FIG. 1B, a precursor device 11 may be formed by depositing epitaxial layers on a substrate 12 to form the buffer layer 14, the channel layer 16 and the barrier layer 18. Prior to metallization, an etch mask 32 is formed on the surface of the barrier layer 18. The etch mask 32 may comprise photoresist, silicon dioxide, silicon nitride, or any other suitable mask that permits selective etching of the underlying nitride epitaxial layers. The etch mask 32 is patterned using standard photolithography techniques and partially removed. A typical photolithography process can include the steps of adding a layer of photoresist (typically a polymer resin sensitive to light) to a semiconductor structure, positioning a mask over the photoresist, exposing the photoresist to a frequency of light to which it responds (by undergoing a chemical change; usually its solubility in a particular solvent), etching the photoresist to remove the exposed or unexposed pattern (depending upon the resist selected), and then carrying out the next desired step on the remaining pattern.

The barrier and channel layers 16, 18 are then etched away to reveal a portion of the AlN buffer layer 14 on which the IDTs 26, 28 may be formed. The etch mask 32 is then removed and metallization steps are performed to form the contacts 22, 23, 24 and the IDTs 26, 28.

The barrier 18 and the channel 16 layers may be etched using a dry etch process such as reactive ion etching (RIE). Suitable conditions for dry etching the mesa may include dry etching in an Ar environment using $BCl_3$ etchant. For example, a typical process may include flowing Ar at 20-100 sccm and $BCl_3$ at 10-20 sccm in an RIE reactor at a pressure of 5-50 mTorr and an RF power at 50-300W. Actual parameters will depend on the system used and may be determined by those skilled in the art. The etch should be highly selective to etch GaN but not AlN.

An alternative method of fabricating device 10 may be understood with reference to the precursor structure 13 shown in FIG. 1C. The device 10 may be fabricated by placing the substrate 12 into a growth reactor and depositing the AlN buffer layer 14 on the substrate 12 as described above. After formation of the buffer layer 14, the substrate 12 is removed from the growth reactor and a growth mask 34 (which may comprise silicon dioxide, silicon nitride or another suitable material) is formed on the surface of the buffer layer. The mask layer 34 is patterned using standard photolithographic techniques as described above to reveal a portion of the surface of the buffer layer 14. After formation and patterning of the mask layer 34, the substrate 12 is placed back into a growth reactor for the regrowth of channel and the barrier layer 18 and the channel layer 16 (and any other layers that may be present in the device). The contacts 22, 23, 24 and the IDTs 26, 28 may then be formed on the structure after removal of the mask layer 34.

Figure 2A:
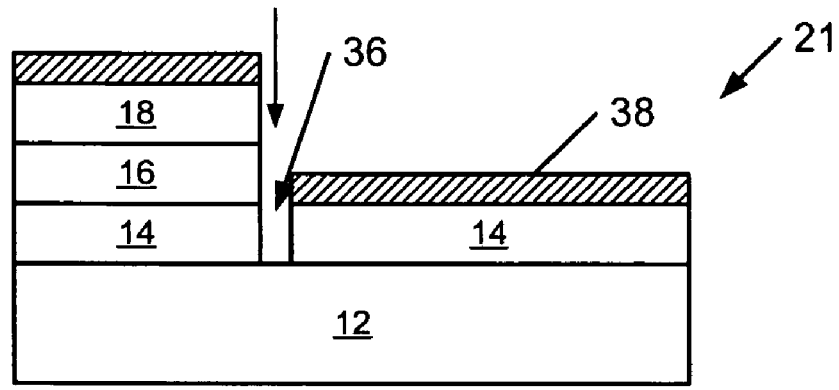
FIGS. 2A-2B are schematic drawings illustrating embodiments of the present invention along with a device precursor that may be an intermediate step in the fabrication of a device as illustrated.
Figure 2B:
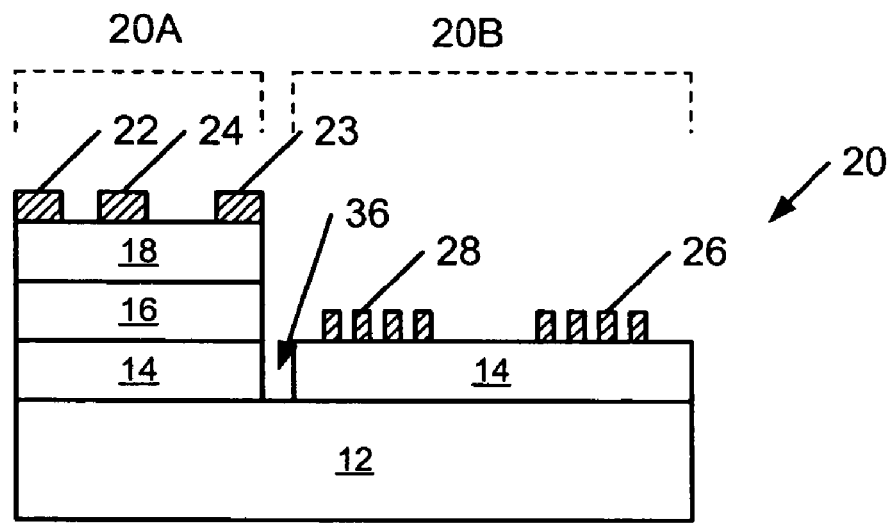

As illustrated in FIGS. 2A and 2B, the device 20 includes a SAW structure 20B that is isolated from a transistor structure 20A by forming a trench 36 between the structures that extends through buffer layer 14. The trench 36 may extend into the substrate 12 depending on the thickness of the buffer layer 14 and the wavelength of the device. As discussed above, a SAW extends for a distance of about one wavelength into the propagating medium. Thus, the trench 36 may extend for a distance of at least about one wavelength in order to provide physical isolation of SAW device 20B.

As illustrated in FIG. 2A, the trench 36 may be formed before, during or after formation of the transistor. For example, an etch mask 38 may be formed on the structure and patterned to reveal a portion of the buffer layer 14 adjacent the transistor mesa. The exposed region is then etched in the manner described above to provide device isolation. After etching, the etch mask is removed and metallization is performed as illustrated in FIG. 2B.

Figure 3A:
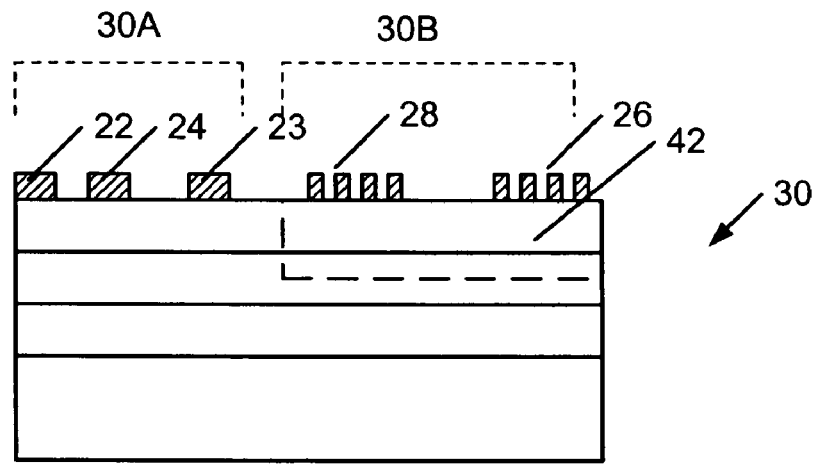
FIGS. 3A-3B are schematic drawings illustrating embodiments of the present invention along with a device precursor that may be an intermediate step in the fabrication of a device as illustrated.
Figure 3B:
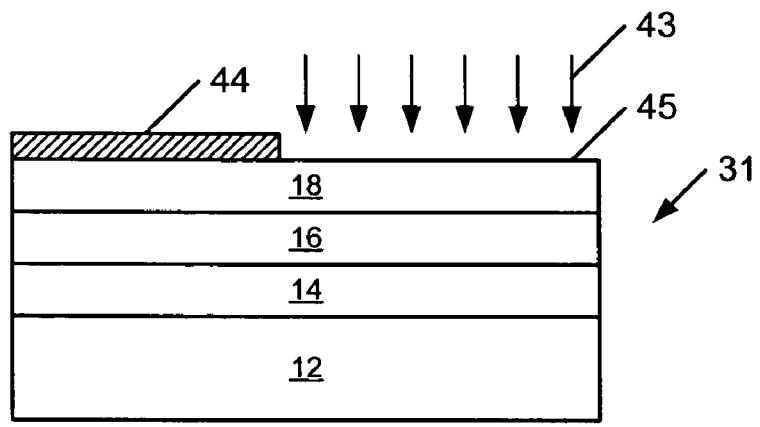

FIGS. 3A-3B illustrate other embodiments of the invention. As FIG. 3A schematically illustrates, a device 30 includes a transistor structure 30A and a SAW device structure 30B formed on a common substrate. However, in this embodiment, the IDTs 26, 28 of the SAW device 30B are formed on the surface of the same epitaxial layer as the transistor electrodes, thus avoiding the need for regrowth or mesa etching.

In order to electrically isolate the SAW device 30B from the transistor structure 30A and reduce loss in the SAW device itself, ions 43, such as nitrogen or phosphorus, are implanted into a region 42 of the device to render the region 42 sufficiently highly resistive as to be electrically inactive.

As illustrated in FIG. 3B, after growth of the epitaxial layers of the transistor structure 30A to form an epitaxial precursor structure 31, a patterned implant mask 44 (which may comprise photoresist) is formed on the surface of the precursor structure 31 and nitrogen ions 43 are implanted into the exposed surface 45 so as to implant the nitrogen ions 43 into the region 42. Other ions can be used to increase the resistivity of the region via implantation, including hydrogen, helium, aluminum, nitrogen, magnesium, zinc and/or calcium.

The implantation can be carried out in a conventional fashion and at room temperature. As presently best understood (and without being limited by a particular theory), the implanting ions create damage within the GaN to produce deep levels within the bandgap. These in turn trap free carriers in the GaN, thus rendering the material more resistive than a GaN layer or region without such an implant. In a HEMT structure, the implanted ions effectively neutralize the conductive 2DEG channel at the interface between the barrier and channel layers.

In certain embodiments, nitrogen atoms are implanted into the exposed region at an energy of 10-400 keV and a dosage of $10^{13}$-$10^{14}$ ions per square centimeter (cm$^{-2}$). Such a dose may be sufficient to neutralize the region 42 or otherwise make the region 42 sufficiently non-conductive such that the transistor structure 30A is electrically isolated from the SAW device 30B such that the electrical performance of either the transistor structure 30A or the SAW device 30B are not substantially impaired by the other device.

Figure 4:
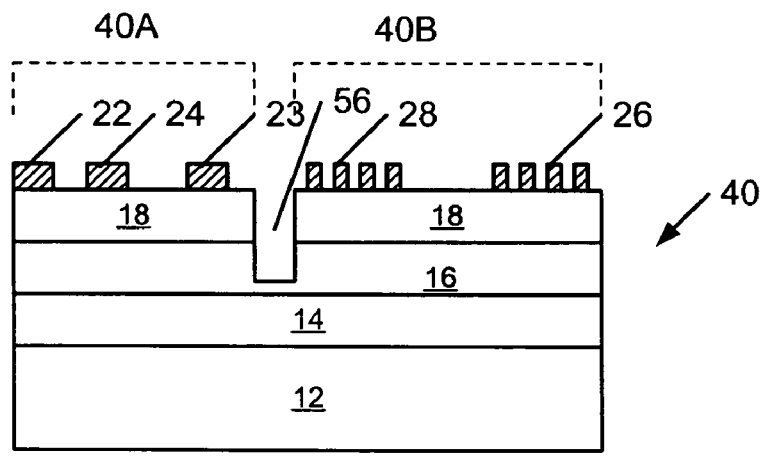
FIG. 4 is a schematic drawing illustrating embodiments of the present invention.

FIG. 4 illustrates a device 40 according to further embodiments of the present invention. As with the embodiments described in connection with FIGS. 3 and 3A, a SAW device 40B is formed on the same epitaxial surface as the transistor structure 40A. However, in addition to the implant neutralization of the layers forming the SAW device 40B, an isolation trench 56 is formed between the SAW structure 40B and the transistor structure 40A using the masking and etching techniques described above in connection with FIGS. 2A and 2B. As discussed above, the depth of the trench 56 may be equal to at least one SAW wavelength.

Figure 5:
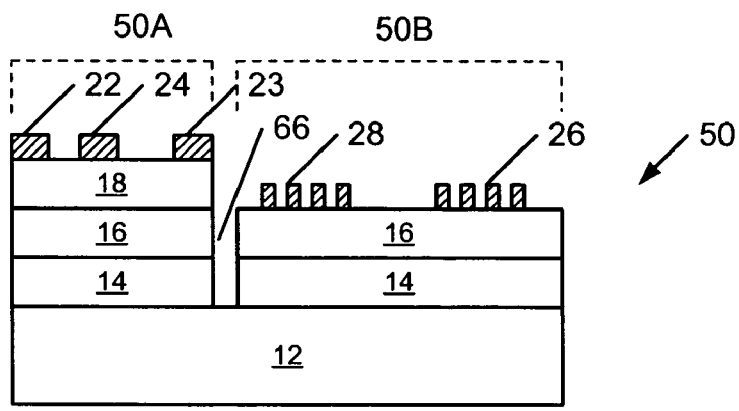
FIG. 5 is a schematic drawing illustrating embodiments of the present invention.

Further embodiments of the present invention are illustrated in FIG. 5. In the embodiments illustrated in FIG. 5, the barrier and the channel layers of the transistor structure 50A are etched down into the thick GaN layer 16 to remove the 2DEG region between the barrier and channel layers. The SAW IDTs are formed on the exposed surface of the GaN layer, which is semi-insulating as grown. An optional isolation trench 66 may be etched between the transistor structure 50A and the SAW device structure 50B using the techniques described above.

Figure 6A:
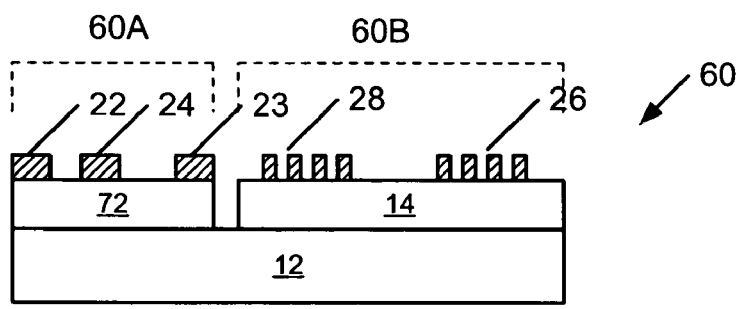
FIGS. 6A-6C are schematic drawings illustrating embodiments of the present invention along with a device precursor that may be an intermediate step in the fabrication of a device as illustrated.
Figure 6B:
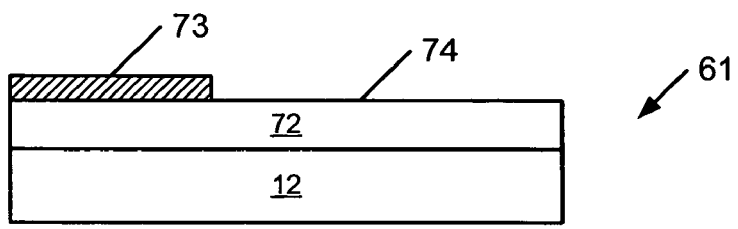
Figure 6C:
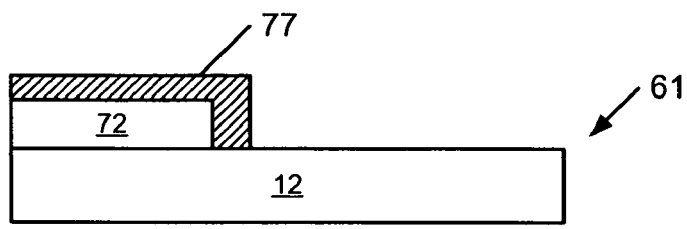

In the embodiments illustrated in FIGS. 6A-6C, an AlN-based SAW structure 60B is integrated on the same substrate as a SiC MESFET structure 60A. Techniques for growing epitaxial layers of silicon carbide are disclosed in U.S. Pat. Nos. 6,063,186; 6,297,522; 6,217,662; 5,155,062; 4,946,547; 4,912,063; 4,912,064; and 5,011,549, the disclosures of which are incorporated herein by reference. Techniques for growing epitaxial layers of silicon carbide are also disclosed in U.S. application Ser. No. 09/715,576 filed Nov. 17, 2000 for "SUSCEPTOR DESIGNS FOR SILICON CARBIDE THIN FILMS"; U.S. application Ser. No. 09/790,169 filed Feb. 21, 2001 for "SUSCEPTOR DESIGNS FOR SILICON CARBIDE THIN FILMS"; U.S. Publication No. 2001/0170491 published Nov. 21, 2002 for "SEED CRYSTAL HOLDERS AND SEED CRYSTALS FOR FABRICATING SILICON CARBIDE CRYSTALS AND METHODS OF FABRICATING SILICON CARBIDE CRYSTALS"; U.S. Publication No. 2002/0090454 published Jul. 11, 2002 for "GAS-DRIVEN ROTATION APPARATUS AND METHOD FOR FORMING SILICON CARBIDE LAYERS"; U.S. application Ser. No. 10/017,492 filed Oct. 30, 2001 for "INDUCTION HEATING DEVICES AND METHODS FOR CONTROLLABLY HEATING AN ARTICLE"; and U.S. application Ser. No. 10/117,858 filed Apr. 8, 2002 for "GAS-DRIVEN PLANETARY ROTATION APPARATUS AND METHODS FOR FORMING SILICON CARBIDE LAYERS" the disclosures of which are incorporated herein by reference.

The SiC epitaxial layers 72 may be grown using techniques described in the foregoing patents and applications to form a precursor structure 61 as illustrated in FIG. 6B. An etch mask 73 is formed on the surface of the SiC epitaxial layers 72 and patterned to reveal a portion of the surface 74 of the SiC epitaxial layers 72. The precursor structure 61 is then etched to reveal a portion of the semi-insulating SiC substrate. The remaining SiC epitaxial layers are then masked with a growth mask 77 illustrated in FIG. 6C that extends just past the edge of the SiC epitaxial layers 72 by a predetermined distance that may depend on the thickness of the growth mask 77. The etch mask 73 may or may not be removed prior to formation of the growth mask 77.

A layer of crystalline AlN 14 is regrown on the exposed substrate and the mask 77 is removed. Because the regrown AlN layer 14 is separated from the SiC epitaxial layer 72, the SAW structure 60B and the MESFET structure 60A are isolated as grown. The metal contacts 22, 23, 24 are formed on the SiC epitaxial layers 72 and the SAW IDTs 26, 28 are then formed on the AlN layer to complete the device.

Figure 7:
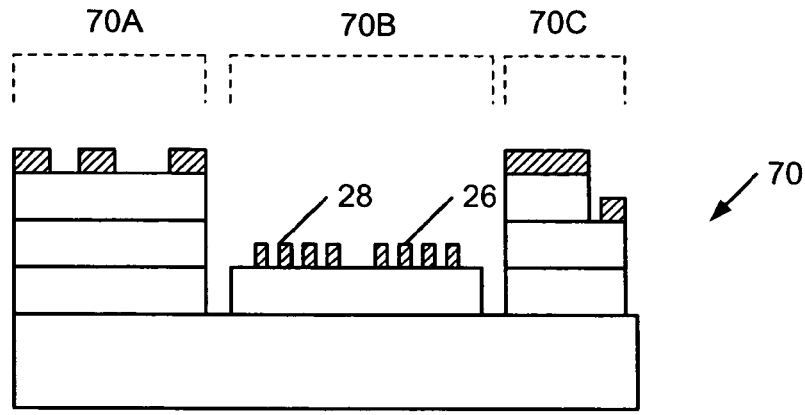
FIG. 7 is a schematic drawing illustrating embodiments of the present invention.
Figure 8:
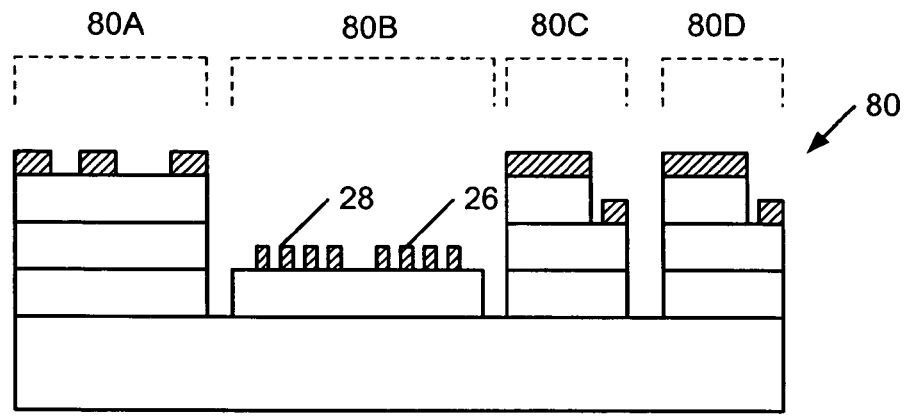
FIG. 8 is a schematic drawing illustrating embodiments of the present invention.

As illustrated in FIG. 7, the foregoing techniques can be extended to integrate more than one type of device on the same substrate as one or more SAW devices. For example, the device 70 includes a transistor structure 70A, a SAW device 70B and a photodetector structure 70C integrated on the same substrate 12. Such a device may, for example, be used as a monolithic element capable of receiving, amplifying, and filtering an optical information signal. Likewise, the embodiments illustrated in FIG. 8 include a transistor structure 80A, a SAW device 80B, a photodetector structure 80C, and an emitter structure 80D integrated on the same substrate 12. Such devices may, for example, be used as a monolithic element capable of receiving, amplifying, and filtering an optical information signal and transmitting an information signal. The design of GaN-based emitters and photodetectors is well known to those skilled in the art. Examples of GaN-based photodetectors are illustrated in U.S. Pat. Nos. 6,495,852 and 6,265,727, which are incorporated herein by reference. Examples of GaN-based emitters are illustrated in U.S. Pat. Nos. 5,523,589 and 5,739,554, which are incorporated herein by reference.

Other circuit elements may be integrated onto the same substrate as the SAW device and the electronic device. For example, capacitors, inductors, resistors, delay lines and the like may be integrated into the device as well.

Integration of different types of nitride devices on a common substrate poses challenges, because many types of devices, such as transistors, emitters, limiters, etc., have complex epitaxial structures which are tailored to the operation of a particular type of device. Embodiments of the present invention arise from a recognition that while certain devices have different epitaxial structures, some aspects of those structures may be similar, and may be used in different types of devices formed on a common substrate.

Figure 12A:
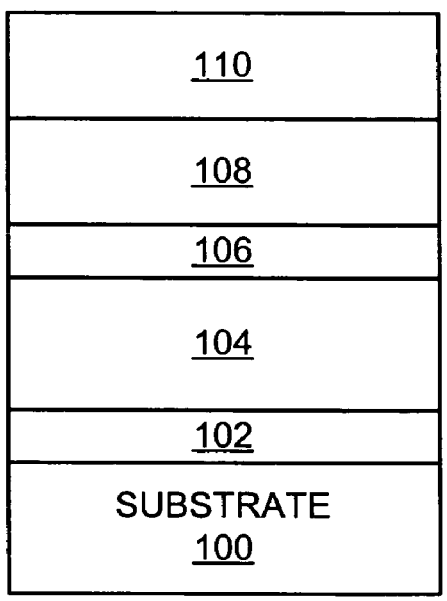
FIGS. 12A-12B are schematic illustrations of two device epitaxial structures.
Figure 12B:
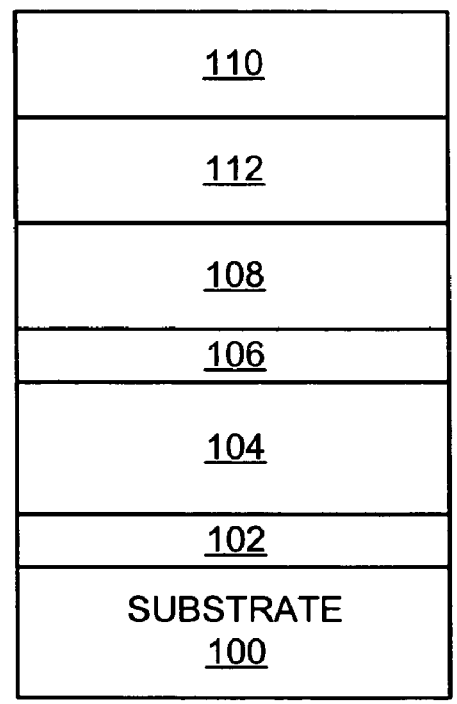

For example, FIG. 12A and FIG. 12B show exemplary epitaxial precursor structures that may be used to form two different types of devices. The epitaxial structure shown in FIG. 12A (Type I) may be used to fabricate a low-noise amplifier or a power amplifier, while the epitaxial structure shown in FIG. 12B (Type II) may be used as a basis for a limiter or an RF switch transistor. In particular, the Type I epitaxial structure of FIG. 12A includes a substrate 100 on which a buffer layer 102 and channel layer 104 are formed. The substrate 100 may include a semi-insulating 6H or 4H silicon carbide substrate. The buffer layer 102 may include an aluminum nitride layer, which may provide an appropriate crystal structure transition between the silicon carbide substrate 100 and the remainder of the device. In particular, the buffer layer 102 may be formed by metal-organic chemical vapor deposition and may have a thickness of about 100 Å to about 10,000 Å. In particular embodiments, the buffer layer 102 may have a thickness of about 1000 Å.

A channel layer 104, which in some embodiments is semi-insulating $Al_xGa_{1-x}N$ ($0 \leq x \leq 1$), is formed on the buffer layer 102. In some embodiments, the channel layer 104 is undoped, but in other embodiments may be doped with various impurities in order to modify the electron concentration in the sheet charge region or the behavior of the conduction band Ec and valence band Ev in the area below the sheet charge region. In some embodiments, the channel layer 104 is about 1 to 5 µm thick. In some embodiments, the channel layer 104 may include a 2 µm thick GaN-based buffer layer with a thin (approximately 100 Å) high-quality channel region (not shown) formed thereon.

A barrier layer 106 is formed on the channel layer 104. In some embodiments, the barrier layer 106 may include AlN, thereby forming a heterojunction between the channel layer 104 and the barrier layer 106. A high bandgap layer 108 is on the barrier layer 106. The high bandgap layer 108 may include $Al_xGa_{1-x}N$ ($0 \leq x \leq 1$) having an aluminum composition of between 20% and 40%. The high bandgap layer 108 may have a higher bandgap than the channel layer 104. The high bandgap layer 108 may be doped with silicon at a doping concentration of about $2 \times 10^{18}$ cm$^{-3}$. The high bandgap layer 108 may be between about 15 nm and 40 nm in thickness, and in some embodiments is about 25 nm thick.

As discussed above, because of the AlGaN/GaN heterobarrier at the interface between the channel layer 104 and the barrier layer 106, a two dimensional electron gas may be induced at the interface.

A high purity silicon nitride layer 110 may be formed on the high bandgap layer 108. High purity silicon nitride may be formed as described in commonly-assigned U.S. patent application Ser. No. 11/286,805 filed Nov. 23, 2005 and entitled "Group III Nitride Semiconductor Devices with Silicon Nitride Layers and Methods of Manufacturing Such Devices" the disclosure of which is hereby incorporated by reference as if fully set forth herein.

The Type I epitaxial structure of FIG. 12A may be useful for forming a HEMT device for a low noise and/or high power amplifier. For example, the Type I epitaxial structure may provide appropriate peak current, transconductance, and/or breakdown voltage characteristics useful for high power amplifier output transistors. The thickness and/or the aluminum percentage of the high bandgap layer 108 may be adjusted to provide appropriate characteristics for a low noise amplifier.

The epitaxial structure shown in FIG. 12B (Type II) is similar to the Type I epitaxial structure shown in FIG. 12A, except that the Type II epitaxial structure includes an additional epitaxial layer 112 between the high bandgap layer 108 and the high purity silicon nitride layer 110. In particular, the high bandgap layer 108, the barrier layer 106 and the channel layer 104 may be the same as in the Type I epitaxial structure. The additional epitaxial layer 112 may include a layer of doped GaN and/or graded AlGaN having a thickness of about 300 Å to about 1000 Å. For an RF switch device and/or a limiter device, the additional epitaxial layer 112 may increase the distance between the top surface of the device and the charge in a 2DEG channel induced at the interface between the channel layer 104 and the barrier layer 106. This may reduce the gate-to-source capacitance of the device, while maintaining a low channel resistance.

Figure 13A:
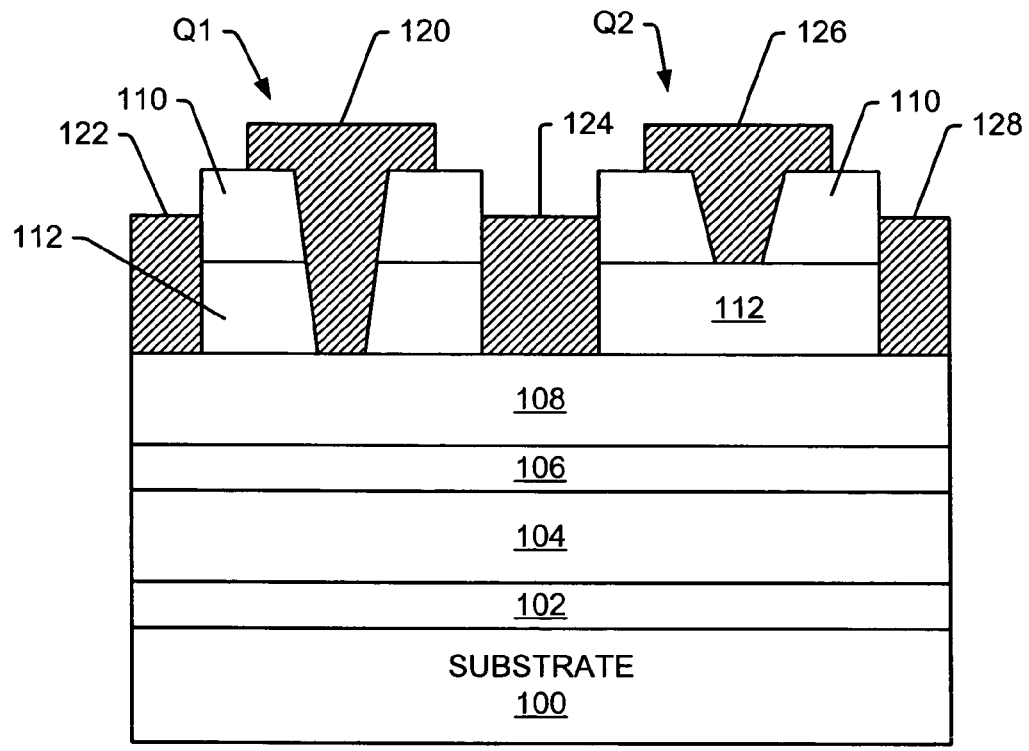
FIG. 13A is a schematic drawing illustrating embodiments of the present invention.

A device having a Type I epitaxial structure and a device having a Type II epitaxial structure may be integrated on a common substrate as illustrated in FIG. 13A. As shown therein, a Type II epitaxial structure may be formed using, for example, conventional MOCVD growth techniques. Source/drain ohmic contacts 122, 124, 128 may be recessed through the high purity silicon nitride layer 110 and the additional epitaxial layer 112. While not illustrated in FIG. 13A, the source/drain ohmic contacts 122, 124, 128 may be fully and/or partially recessed into/through the high bandgap layer 108 and/or the barrier layer 106.

A first transistor Q1 is defined by a gate 120 positioned between adjacent source/drain contacts 122, 124. The first transistor Q1 may be, for example, a high power or low-noise transistor. Thus, in the first transistor Q1, the gate contact 120 is recessed through both the high purity silicon nitride layer 110 and the additional epitaxial layer 112, as shown in FIG. 13A.

Accordingly, for the first transistor Q1, the gate etch is used to remove a portion, or all, of the additional epitaxial layer 112 underneath the high purity silicon nitride layer 110. A low channel or access resistance may be maintained in the non-gated regions of the first transistor Q1 due to the presence of the additional epitaxial layer 112, which, as explained above, may be a relatively thick GaN cap and/or graded/doped AlGaN as described in Journal of Electronic Materials, Vol. 33, No. 5, 2004, or IEEE Electron Device Letters, Vol. 25, No. 1, January 2004 or Journal Of Applied Physics Volume 94, Number 8, 15 Oct. 2003.

A second transistor Q2 is defined by a second gate contact 126 positioned between source/drain contacts 124, 128. The second transistor Q2 may be configured, for example, as a limiter and/or an RF switch. The second gate contact 126 may be recessed only through the high purity silicon nitride layer, and is not recessed through, or is only partially recessed through, the additional epitaxial layer 112. The presence of the additional epitaxial layer 112 may reduce the gate capacitance of the second transistor Q2. Thus, two transistors Q1 and Q2, having different epitaxial structures and/or different operational characteristics, may be provided on the same substrate by forming a single epitaxial structure and etching the structure appropriately.

Figure 13B:
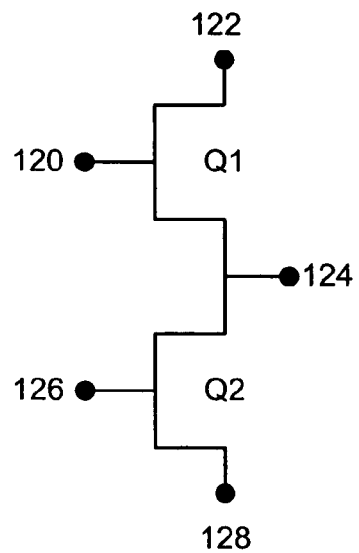
FIG. 13B is an equivalent circuit diagram of two devices formed on a common substrate according to some embodiments of the invention.

A schematic diagram of a possible circuit formed by the first and second transistors Q1 and Q2 is illustrated in FIG. 13B. As shown therein, the first and second transistors may share a common source/drain contact 124.

Figure 14A:
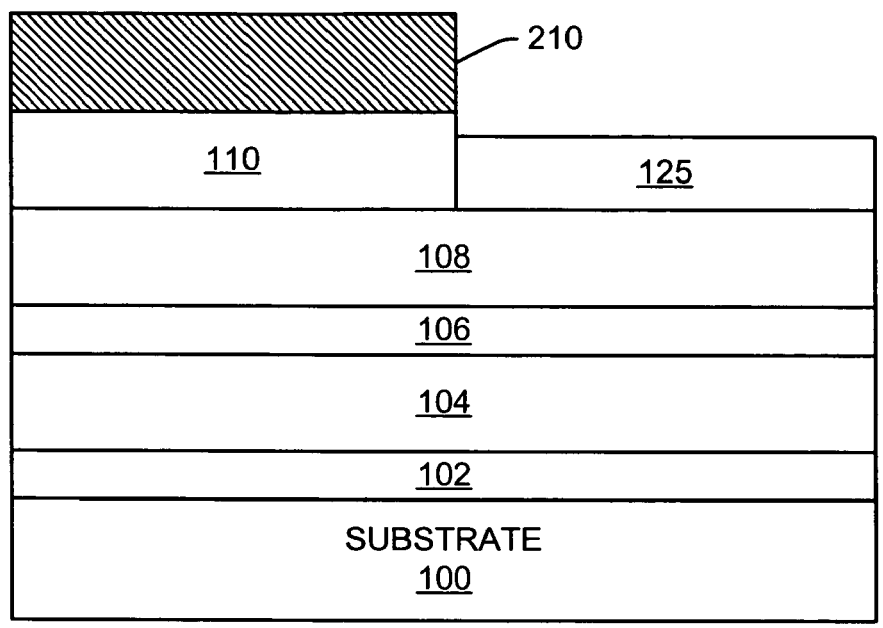
FIG. 14A-14B are schematic drawings illustrating embodiments of the present invention.
Figure 14B:
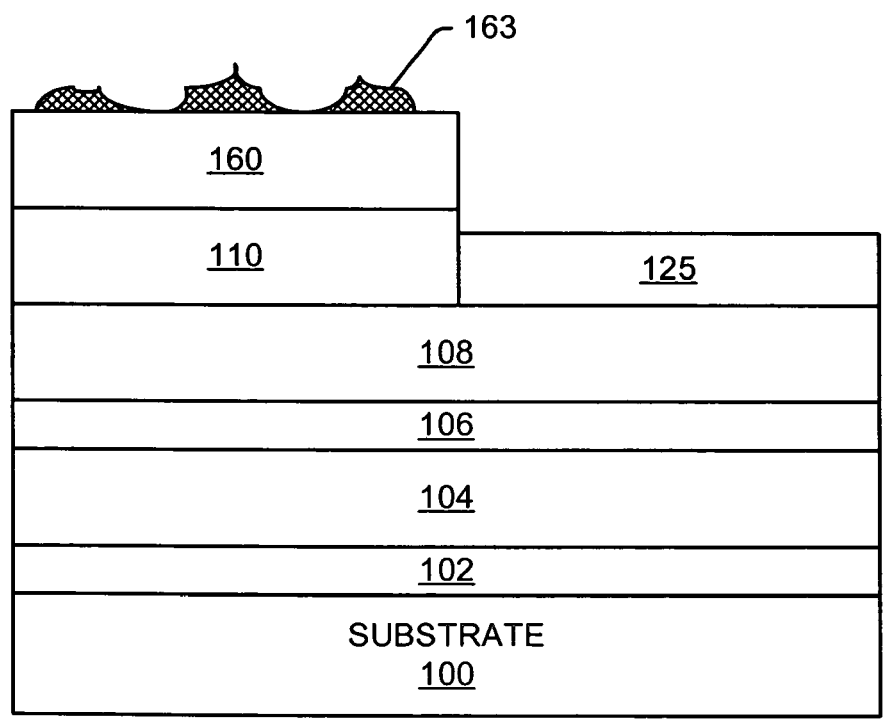

Further methods and structures according to embodiments of the invention are illustrated in FIGS. 14A and 14B. As shown therein, a Type I epitaxial structure similar to the structure illustrated in FIG. 12A is provided. In particular, the structure shown in FIG. 14A includes a buffer layer 102 on a substrate 100. A channel layer 104, a barrier layer 106, a high bandgap layer 108 and a high purity silicon nitride layer 110 are formed on the buffer layer 102. A photoresist mask 210 is formed on a portion of the high purity silicon nitride layer 110, and a portion of the high purity silicon nitride layer exposed by the mask 210 (i.e. not covered by the mask 210) may be etched away using, for example, conventional dry etching techniques. The exposed portions of the high purity silicon nitride layer 110 may be etched away, for example, to reveal the high bandgap layer 108 beneath the high purity silicon nitride layer 110.

Following the selective etching of the high purity silicon nitride layer, the photoresist mask 210 may be removed, and a epitaxial layer 125 may be epitaxially regrown on the exposed high bandgap layer 108. The epitaxial layer 125 may be similar to the epitaxial layer 112 shown in FIG. 13A. For example, the epitaxial layer 125 may include doped GaN and/or graded AlGaN, and may have a thickness of about 30 Å to about 1000 Å.

The high purity silicon nitride layer 110 may act as a growth mask for the growth of the epitaxial layer 125. That is, when the epitaxial layer 125 is regrown, for example using MOCVD, crystalline material may not nucleate and/or grow on the high purity silicon nitride layer 110, as the high purity silicon nitride layer 110 may not provide a suitable template for epitaxial growth.

In some embodiments, however, it may be desirable to provide a separate growth mask on the high purity silicon nitride layer 110 when the epitaxial layer 125 is regrown in order to reduce and/or prevent stray nucleation on the silicon nitride layer 110. The photoresist mask 210 used as an etch mask when the high purity silicon nitride layer 110 is etched may not be useful as a growth mask, because the polymer-based material used in photoresist may not withstand the high temperatures required for epitaxial growth of nitride materials. Thus, a separate growth mask may be provided on the high purity silicon nitride layer 110. For example, referring to FIG. 14B, a growth mask 160 may be formed on the high purity silicon nitride layer 110. The growth mask may include, for example, silicon dioxide and/or aluminum nitride. The growth mask may be formed on the high purity silicon nitride layer 110 prior to etching the high purity silicon nitride layer 110, and may be patterned using conventional lithographic techniques. For a silicon dioxide growth mask, the silicon dioxide should have a thickness greater than 1000 Å.

In some embodiments, the same etch mask 210 may be used to pattern both the etch mask 160 and the high purity silicon nitride layer 110. In other embodiments, the etch mask 210 may be used to pattern the growth mask 160, and the growth mask 160 may be used as an etch mask for etching the high purity silicon nitride layer 110, as well as for preventing and/or reducing unwanted nucleation on the high purity silicon nitride layer 110 during epitaxial regrowth of the epitaxial layer 125.

As shown in FIG. 14B, during epitaxial regrowth of the epitaxial layer 125, some random crystallite and/or polycrystalline material 163 may nucleate and/or grow on the growth mask 160. The unwanted material 163 may be removed by removing the growth mask 160 from the high purity silicon nitride layer 110, which may be done, for example, by performing a buffered oxide etch (BOE) if the growth mask 160 is silicon dioxide. A BOE may etch silicon dioxide but may not etch high purity silicon nitride 110.

Figure 15:
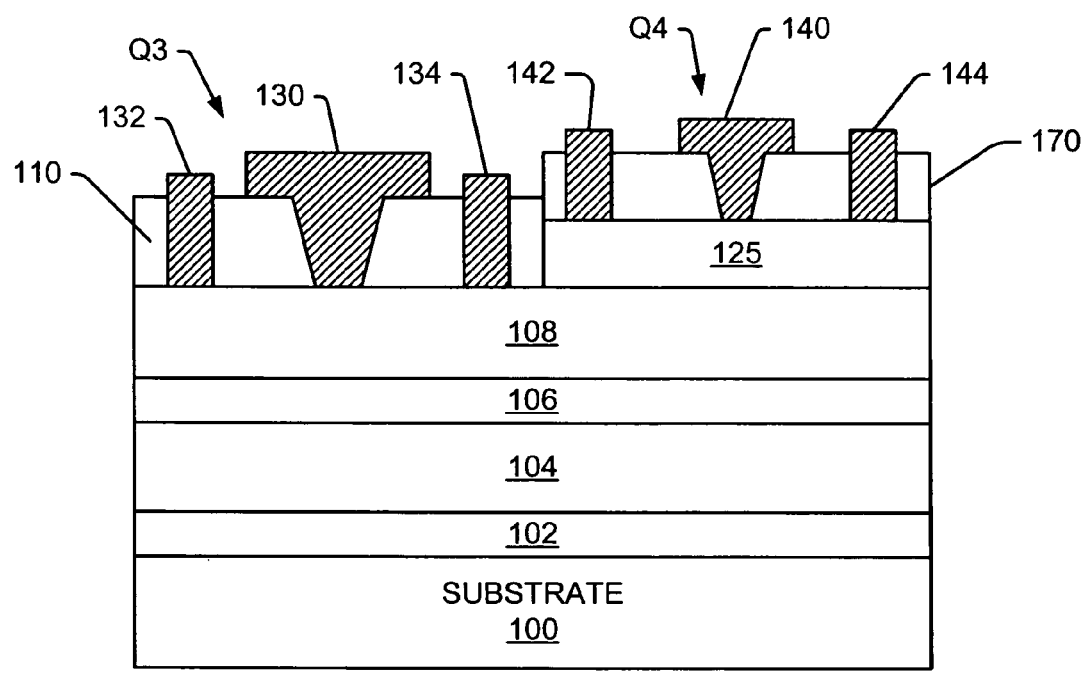
FIG. 15 is a schematic drawing illustrating embodiments of the present invention.

Following regrowth of the epitaxial layer 125, a plurality of devices may be defined in the epitaxial structure by forming one or more electrical contacts on the structure. For example, as shown in FIG. 15, a first transistor Q3, which may be a low noise amplifier and/or a high power amplifier, may be defined by forming source/drain contacts 132, 134 on the high bandgap layer 108. The source/drain contacts 132, 134 may be partially and/or fully recessed through the high bandgap layer 108. A gate contact 130 for the first transistor Q3 is recessed through the high purity silicon nitride layer 110. In some embodiments, the transistor Q3 may have an insulating gate structure (e.g. a metal-insulator-semiconductor heterojunction field effect transistor, or MISHFET) as shown in any of U.S. Pre-grant Publication No. 2003/0020092 entitled "Insulating Gate AlGaN/GaN HEMT", U.S. Pre-grant Publication No. 2005/0170574 entitled "Nitride-based Transistors with a Protective Layer and Low-damage Recess and Method of Fabrication Thereof," U.S. patent application Ser. No. 11/185,398, filed Jul. 20, 2005 and entitled "Nitride-Based Transistors and Fabrication Methods With an Etch Stop Layer" and/or U.S. patent application Ser. No. 11/187,171, filed Jul. 21, 2005 and entitled "Switch Mode Power Amplifier using MIS-HEMT with Field Plate Extension," the disclosures of which are incorporated herein by reference as if fully set forth herein.

A second transistor Q4 may be formed in the region of the structure in which the epitaxial layer 125 was regrown. In particular, the second transistor Q4 may be defined by a gate contact 140 that is recessed through a silicon nitride layer 170 that may be formed on the epitaxial layer 125. Source and drain contacts 142, 144 complete the second transistor Q4.

It will be appreciated that the second transistor Q4 may be configured as a two terminal device, such as a limiter diode, by electrically connecting the gate contact 140 and the drain contact 144. When so configured, the gate and drain contacts 140, 144 together function as a device anode, while the source contact 142 may function as a device cathode. A limiter diode may be used, for example, as an input to an amplifier transistor, such as the first transistor Q3.

It will be further appreciated that the epitaxial layers of the first transistor Q3 may serve as the substrate on which the epitaxial layers of the second transistor Q4 are formed.

Accordingly, some embodiments of the invention provide a first nitride based electronic device including a first nitride based epitaxial structure, and a second nitride based electronic device having a second nitride based epitaxial structure formed on the first nitride based epitaxial structure. In the case of the structure shown in FIG. 15, the buffer layer 102, channel layer 104, barrier layer 106 and high bandgap layer 108 form a first epitaxial structure for a first transistor Q3, while the epitaxial layer 125 forms a second epitaxial structure, formed on the first epitaxial structure, for a second transistor Q4.

Figure 16:
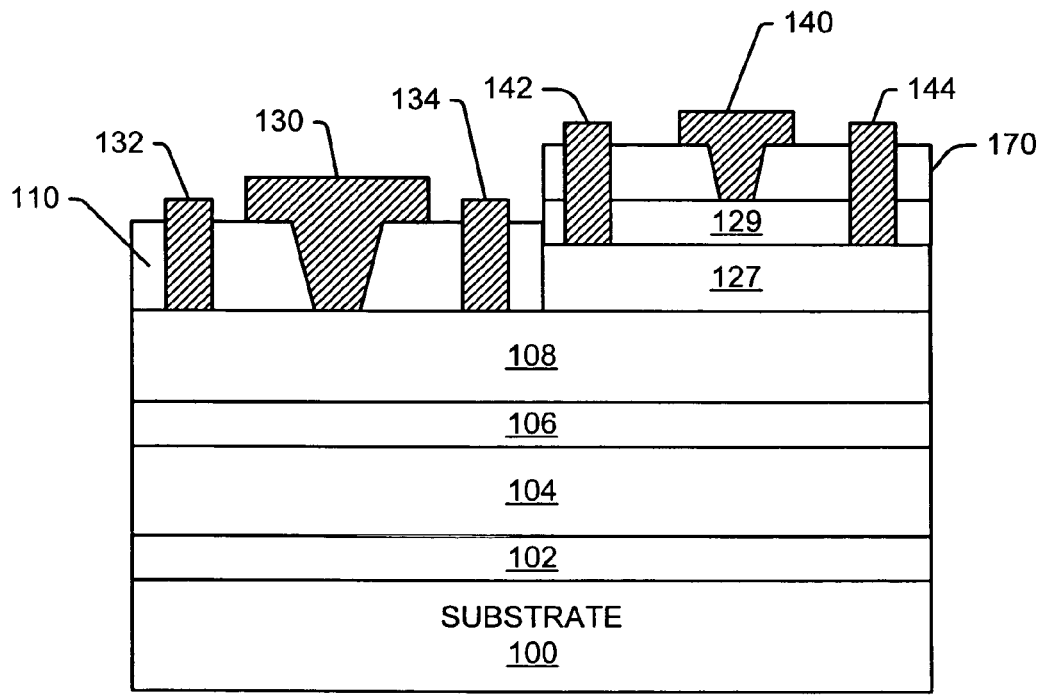
FIG. 16 is a schematic drawing illustrating embodiments of the present invention.

Referring to FIG. 16, In some embodiments in which a limiter diode is formed, it may be desirable to provide a first epitaxially regrown layer 127 of n+ GaN on the high bandgap layer 108 and a second epitaxially regrown layer 129 of n− GaN on the first regrown layer 127. The first regrown layer 127 may have a thickness of about 0.5 μm and a doping concentration of about $2\times10^{18}$ cm$^{-3}$ or more, which provides a surface charge density of at least about $1\times10^{14}$ cm$^{-2}$. The second regrown layer 129 may have a thickness of at least 1000 Å, and may be doped lightly enough that it is fully depleted at zero bias. In particular, the second regrown layer 129 may have a doping concentration of less than about $1\times10^{16}$ cm$^{-3}$.

Embodiments of the present invention may provide both enhancement and depletion mode nitride-based transistor devices on a common substrate. For example, a depletion mode device may be formed by providing an epitaxial structure, such as the Type I epitaxial structure shown in FIG. 12A, and forming ohmic contacts thereto as described in connection with FIG. 14C. An enhancement mode device may be formed using the same epitaxial structure, but by recessing the gate contact into the underlying high bandgap layer 108.

Some embodiments of the invention provide for the integration of both silicon carbide devices and nitride devices on a common substrate. For example, as illustrated in FIG. 6A, a silicon carbide MESFET device and a nitride based SAW device may be integrated on a common substrate. As discussed above in connection with FIG. 6A, it may be possible to form an epitaxial layer 72 of silicon carbide on a substrate on which a layer 14 of aluminum nitride is also formed.

However, it may be difficult to form both silicon carbide epitaxial layers and gallium nitride-based epitaxial layers on a common substrate, since gallium nitride based epitaxial layers are conventionally grown on on-axis substrates, while silicon carbide epitaxial layers are conventionally grown on off-axis substrates, although it is possible to grow relatively thin (<100 nm) epitaxial layers of silicon carbide on an on-axis substrate.

Figure 17A:
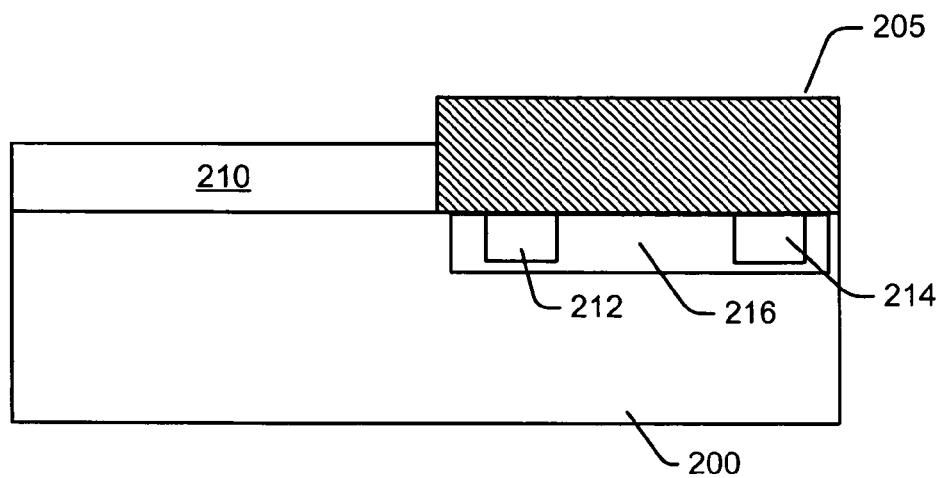
FIGS. 17A-17B are schematic drawings illustrating embodiments of the present invention.
Figure 17B:
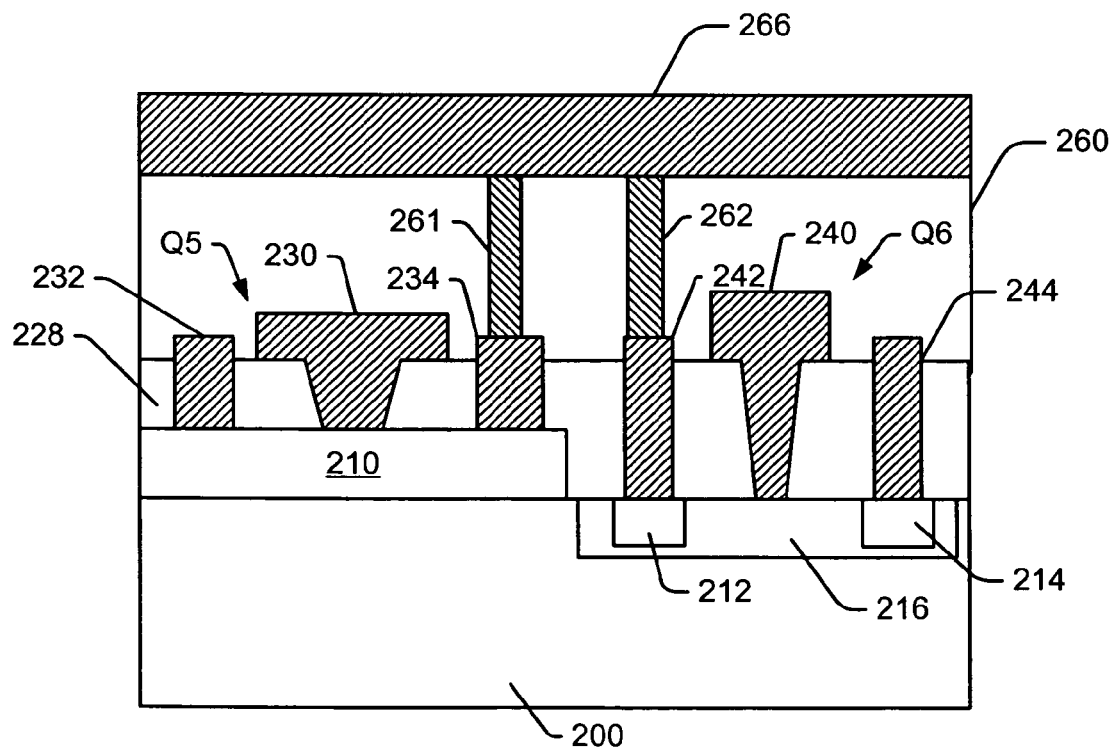

According to some embodiments of the invention, a silicon carbide MESFET may be formed on an on-axis substrate by implanting source/drain regions as well as a channel region in an on-axis semi-insulating silicon carbide substrate, as illustrated in FIGS. 17A and 17B. As shown therein, one or more implant regions may be formed in an on-axis, semi-insulating 4H—SiC substrate by means of ion implantation. For example, as shown in FIG. 17A, an n-type channel region 216 may be formed in the substrate 200 by selective implantation of nitrogen and/or phosphorus ions. Furthermore, n+ source/drain regions 212, 214 may be formed in the substrate 200 by ion implantation. Multiple implantation steps with different implant energies/doses may be performed in order to provide a desired doping profile. Implantation of dopants into bulk silicon carbide layers is known in the art. After implantation, the dopants may be activated by annealing the implanted structure at a temperature of about 1400° C. to about 1700° C. for about 5 minutes to about 30 minutes. In particular, it may be desirable to activate the implanted dopants prior to epitaxial growth of nitride layers on the substrate 200, as the temperatures required to activate dopants implanted in silicon carbide may be detrimental to nitride-based epitaxial layers.

As further illustrated in FIG. 17A, The implanted regions of the substrate 200 may then be masked with a growth mask 205. The growth mask 205 may include, for example, a SiN and/or SiO$_2$ pattern formed on the surface of the substrate 200. An epitaxial structure 210 may be grown on the exposed portions of the substrate 200 using conventional epitaxial growth techniques. For example, the epitaxial structure 210 may include a buffer layer, a channel layer, a barrier layer, and a high bandgap layer, which may have structures similar to the corresponding layers shown, for example, in FIG. 12A, in order to provide an epitaxial precursor for a HEMT device. However, it will be appreciated that other epitaxial structures could be formed, depending on the type/characteristics of nitride device desired.

Referring to FIG. 17B, the growth mask 205 may be removed, and a passivation layer 228, such as silicon dioxide and/or silicon nitride, may be formed on exposed portions of the substrate 200 and the epitaxial structure 210. Alternatively, the growth mask may be left on the substrate as a passivation layer, and a second passivation layer may be formed on the nitride epitaxial layers. Accordingly, while a single passivation layer 228 is illustrated in FIG. 17B, the passivation layer on the nitride epitaxial structure 210 may be different from the passivation layer on the silicon carbide substrate 200. Furthermore, the passivation layer 228 may include multiple passivation layers of the same and/or different types of materials stacked on one another.

A first gate contact 230 and corresponding source/drain contacts 232, 234 may be formed on the epitaxial structure 210 to define a HEMT transistor device Q5, and a second gate contact 240 may be formed on the implanted channel region 216 along with corresponding source/drain contacts 242, 244, to define a silicon carbide MESFET device Q6 in the substrate 200. The nitride device Q5 and the silicon carbide device Q6 may be interconnected on the common substrate 200 by one or more levels of interconnect metallization. For example, a dielectric layer 260 may be formed on the nitride device Q5 and the silicon carbide device Q6. Metal contact plugs 261, 262 may be formed through the dielectric layer 260 to contact electrical contacts of the nitride device Q5 and the silicon carbide device Q6, respectively. The contact plugs 261, 262 may be electrically connected, for example, by an overlayer metal 266 formed on the dielectric layer 260. Other connections between the nitride device Q5 and the silicon carbide device Q6 are possible.

Accordingly, in some embodiments of the invention, a silicon carbide transistor device may be formed on the same substrate as a nitride-based transistor device to form a monolithically integrated device structure. Monolithically integrated nitride devices, and monolithically integrated silicon carbide/nitride devices, may have particular applications in monolithic microwave integrated circuits, in which it may be desirable to carefully control the orientation, placement and/or interconnection of devices, due to the high frequency and/or high power of signals processed by such devices. For example, when devices are not monolithically integrated, it may be necessary to interconnect such devices using electrical traces and/or wires, which may add unwanted inductance, capacitance and/or resistance to the circuit. Such interconnections may also increase the difficulty of circuit design, since the circuit designer must take into account additional signal delays and/or signal dispersion associated with chip-to-chip interconnections.

It will be appreciated that the device structures illustrated herein may be representative unit cell structures that are replicated in larger devices, which may have multiple gate fingers on multiple active regions. Furthermore, while some embodiments of the invention employ semi-insulating silicon carbide substrates, other types and/or conductivities of substrates may be utilized.

While embodiments of the present invention have been described with reference to isolation of the device(s) from other devices on a common substrate through the use of etching and/or selective growth processes, other techniques of trench formation such as sawing, laser ablation or other techniques known to those of skill in the art may be utilized to provide such isolation trenches. Device isolation may also be provided by isolation implants or other means.

Embodiments of the invention have been set forth in the drawings and specification, and although specific terms have been employed, they are used in a generic and descriptive sense only and not for purposes of limitation, the scope of the invention being defined in the claims.

That which is claimed is:

1. A monolithic electronic device, comprising:
    a common nitride epitaxial layer;
    a first type of nitride device including a first epitaxial nitride structure on the common nitride epitaxial layer;
    a second type of nitride device, different from the first type of nitride device, including a second epitaxial nitride structure that is different from the first epitaxial nitride structure on the common nitride epitaxial layer;
    a first plurality of electrical contacts on the first epitaxial nitride structure, the first plurality of contacts defining a first electronic device of the first type of nitride device; and
    a second plurality of electrical contacts on the second epitaxial nitride structure, the second plurality of contacts defining a second electronic device of the second type of electronic device;
    wherein the common epitaxial layer comprises a layer of semi-insulating $Al_xGa_{1-x}N$ (0<x<1).

2. The monolithic electronic device of claim 1, wherein the first epitaxial nitride structure comprises:
    a nitride channel layer;
    a nitride barrier layer on the nitride channel layer, the nitride barrier layer having a higher bandgap than the nitride channel layer, wherein the nitride barrier layer and the nitride channel cooperatively induce a two-dimensional electron gas at an interface between the nitride channel layer and the nitride barrier layer.

3. The monolithic electronic device of claim 2, further comprising a high bandgap layer on the barrier layer and a silicon nitride layer on the high bandgap layer.

4. The monolithic electronic device of claim 1, wherein the second nitride epitaxial structure comprises a layer of $Al_xGa_{1-x}N$ ($0 \leq x \leq 1$) having a thickness of about 300 Å to about 1000 Å.

5. The monolithic electronic device of claim 1, wherein the first electronic device comprises a high electron mobility transistor.

6. The monolithic electronic device of claim 5, wherein the second electronic device comprises a surface acoustic wave device.

7. The monolithic electronic device of claim 5, wherein the second electronic device comprises a diode.

8. The monolithic electronic device of claim 5, wherein the second electronic device comprises a field effect transistor.

9. The monolithic electronic device of claim 8, wherein the second electronic device includes source, drain and gate contacts, and wherein the gate and drain contacts of the second electronic device are electrically coupled to form an anode.

10. The monolithic electronic device of claim 9, wherein the second epitaxial nitride structure comprises a first layer of n-type $Al_xGa_{1-x}N$ ($0 \leq x \leq 1$) on the first epitaxial nitride structure and a second layer of n-type $Al_xGa_{1-x}N$ ($0 \leq x \leq 1$) on the first layer of n-type $Al_xGa_{1-x}N$ ($0 \leq x \leq 1$), wherein the first layer of n-type $Al_xGa_{1-x}N$ ($0 \leq x \leq 1$) has a surface charge density of about $1 \times 10^{14}$ cm$^{-2}$, and the second layer of n-type $Al_xGa_{1-x}N$ ($0 \leq x \leq 1$) has a doping concentration of less than about $1 \times 10^{16}$ cm$^{-3}$.

11. The monolithic electronic device of claim 5, wherein the second electronic device comprises a MISHFET.

* * * * *